(12) United States Patent
Baba et al.

(10) Patent No.: US 7,489,717 B2
(45) Date of Patent: Feb. 10, 2009

(54) SURFACE-EMITTING SEMICONDUCTOR LASER AND METHOD FOR MANUFACTURING THEREOF AS WELL AS OPTICAL DEVICE

(75) Inventors: Toshihiko Baba, Tokyo (JP); Atsushi Matsuzono, Kanagawa (JP); Akio Furukawa, Tokyo (JP); Satoshi Sasaki, Kanagawa (JP); Mitsunari Hoshi, Kanagawa (JP)

(73) Assignees: Sony Corporation, Tokyo (JP); Toshihiko Baba, Tokyo (JP)

( * ) Notice: Subject to any disclaimer, the term of this patent is extended or adjusted under 35 U.S.C. 154(b) by 190 days.

(21) Appl. No.: 10/977,197

(22) Filed: Oct. 28, 2004

(65) Prior Publication Data

US 2005/0089075 A1    Apr. 28, 2005

(30) Foreign Application Priority Data

Oct. 28, 2003  (JP)  ............................ P2003-367741
Apr. 30, 2004  (JP)  ............................ P2004-136295

(51) Int. Cl.
*H01S 5/00*    (2006.01)
(52) U.S. Cl. ................................. 372/45.01; 372/46.01
(58) Field of Classification Search .................. 372/50, 372/96, 19
See application file for complete search history.

(56) References Cited

U.S. PATENT DOCUMENTS

| | | | | |
|---|---|---|---|---|
| 4,703,471 A | * | 10/1987 | Fitelson et al. | ................. 398/43 |
| 4,800,565 A | * | 1/1989 | Yoshizawa et al. | ........ 372/45.01 |
| 6,881,984 B2 | * | 4/2005 | Takaoka | ...................... 257/98 |
| 6,990,128 B2 | | 1/2006 | Koyama et al. | |
| 7,061,945 B2 | * | 6/2006 | Cox et al. | ...................... 372/19 |

(Continued)

FOREIGN PATENT DOCUMENTS

JP    2002-292781    10/2002

(Continued)

OTHER PUBLICATIONS

Yokouchi et al., "Vertical-Cavity Surface-Emitting Laser Operating With Photonic Crystal Seven-Point Defect Structure", Applied Physics Letters, vol. 82, No. 21, May 26, 2003, pp. 3608-3610.

(Continued)

*Primary Examiner*—Minsun Harvey
*Assistant Examiner*—Patrick Stafford
(74) *Attorney, Agent, or Firm*—Bell, Boyd & Lloyd LLP

(57) ABSTRACT

A surface-emitting semiconductor laser (VCSEL) having a structure in which the single horizontal mode of high power is stably maintained, and an optical device including a light-source device having this surface-emitting semiconductor laser are provided. A scattering-loss-structure portion composed of a low refractive-index region is disposed around a main current path in a surface-emitting semiconductor laser, namely around a cavity structure portion; the low refractive-index region is disposed at intervals; and the shape of the tip portion opposing to the center portion is set to be a tapered shape, for example, at an acute angle. Accordingly, in the cavity structure portion, the loss of light-emitting laser of a high-order mode localized in the outer circumferential portion becomes large, so that a surface-emitting semiconductor laser that oscillates the single-mode laser with favorable performance is constructed.

15 Claims, 18 Drawing Sheets

U.S. PATENT DOCUMENTS

2002/0141472 A1    10/2002    Koyama et al.
2002/0141478 A1    10/2002    Koyama et al.

FOREIGN PATENT DOCUMENTS

JP           2004-128351       4/2004

OTHER PUBLICATIONS

European Search Report, dated Mar. 14, 2007, 4 pages.
Yokouchi et al., "Vertical-cavity surface-emitting laser operating with photonic crystal seven-point defect structure," Applied Physics Letters, vol. 82, pp. 3608-3610, 2003.
Zhou et al., "High-Power Single-Mode Antiresonant Reflecting Optical Waveguide-Type Vertical-Cavity Surface-Emitting Lasers," Journal of Quantum Electronics, vol. 38, pp. 1599-1606, 2002.
Shinada et al., "Single High-Order Transverse Mode Surface-Emitting Laser With Controlled Far-Field Pattern," IEEE Photonics Technology Letters, vol. 14, pp. 1641-1643, 2002.
Unold et al., "Single-Mode VCSELs," Proceedings of SPIE, vol. 4649, pp. 218-229, 2002.
Song et al., "Single-fundamental-mode photonic-crystal vertical-cavity surface-emitting lasers," Applied Physics Letters, vol. 80, pp. 3901-3903, 2002.

* cited by examiner

SURFACE-EMITTING SEMICONDUCTOR LASER AND METHOD FOR MANUFACTURING THEREOF AS WELL AS OPTICAL DEVICE

CROSS REFERENCE TO RELATED APPLICATIONS

This application claims priority to Japanese Patent Application Nos. P2003-367741 filed on Oct. 28, 2003, and P2004-136295 filed on Apr. 30, 2004, the disclosures of which are incorporated by reference herein.

BACKGROUND OF THE INVENTION

The present invention relates to a surface-emitting semiconductor laser and a method for manufacturing thereof as well as an optical device including a light-source device in which the surface-emitting semiconductor laser is used. In particular, the present invention relates to a surface-emitting semiconductor laser in which expansion of the mode-field diameter allows for an increase in output with maintaining a single horizontal mode and a method for manufacturing thereof as well as an optical device.

A surface-emitting semiconductor laser is used, for example, as a light-source device for the optical communication when the data communication is performed.

A high power output in such a surface-emitting semiconductor laser is conventionally attained by making an emitting area large. However, when an emitting area is made large, conventionally a single horizontal mode becomes a multi-mode.

On the other hand, an optical fiber having a single horizontal mode is used in the long distance transmission, for example, and favorably, input laser light for that transmission is a single horizontal mode to obtain a high coupling efficiency and a high transmission efficiency. A high power output laser of the single horizontal mode is required for the above reason and the like.

In addition, high speed operation is recently required with respect to an optical pickup device used for recording and reproducing on an optical recording medium, and regarding the laser light used as the light-source the increase of the output becomes indispensable while maintaining the singularity of a horizontal mode. Also, the single horizontal mode is indispensable in a printing device such as a laser printer and others, and also the high power output is indispensable in the high-speed processing, the laser in which the single horizontal mode and the high power output are both obtained is required for those optical devices.

A surface-emitting semiconductor laser using a photonic crystal structure was proposed as the surface-emitting semiconductor laser having the above described single horizontal mode. See generally, Japanese Patent Application No. 2002-292781; and Noriyuki Yokouchi, et al, Appl. Phys. Lett. 82, 3608(2003).

Recently, using the photonic crystal structure, the horizontal mode of the surface-emitting laser is controlled to obtain both the expansion of the mode-field diameter that leads to the increase of output and the single horizontal mode.

However, control of the horizontal mode of the surface-emitting semiconductor laser by the photonic crystal is performed based on the concept of decreasing an effective refractive-index difference between the resonator portion that confines the mode and surroundings thereof so that a high-order-mode is made to be the leakage mode. Therefore, the effective refractive-index difference must be decreased in size because as the resonator portion diameter for the increase of output expands in size, it becomes increasingly difficult for the high-order-mode to leak. Accordingly, the principle of a single horizontal mode is extremely weak against the outer disturbance which makes refractive-index distribution occur.

Also, in the surface-emitting semiconductor laser which has a large diameter, an area on the side surface of the resonator portion that functions for the leakage loss decreases in the volume ratio of the resonator portion, so that the Q value of all the modes which include the leakage mode increases. On the other hand, as for a basic mode originally having a small leakage loss and having the large basic value, since a parasitic absorption and scattering-loss remains in the laser, an increase of the Q value is restricted, and an extremely high Q value can not be obtained. Accordingly, since the large Q value ratio between the modes cannot be maintained, the function of selecting a mode is deteriorated.

Even in the laser in which the Q value ratio between the modes is small and the mode selecting function is weak for the outer disturbance as described above, the mode field diameter larger than a conventional single horizontal mode type surface-emitting semiconductor laser is certainly obtained in the case where the drive current is small and the ideal effective refractive-index distribution and carrier density distribution are realized. However, with the increase in the drive current, since the refractive-index distribution which occurs with the rise of temperature when applying electricity and the space gain hole-burning phenomenon in which the mode localized region is selectively come short of a carrier may occur, the condition to maintain the single horizontal mode deteriorates easily, and there is a problem that the horizontal mode becomes a multi mode after all.

Accordingly, a structure to maintain a more stable the single horizontal mode has been required.

SUMMERY OF THE INVENTION

The present invention provides in an embodiment a surface-emitting semiconductor laser and enhanced power output and a single horizontal mode.

A surface-emitting semiconductor laser according to an embodiment includes a vertical direction resonator that is formed by disposing first and second DBRs (Distribution Bragg Reflector) with an active layer in between, in which a scattering-loss-structure portion that makes a scattering-loss generated on the outer circumferential portion of the resonator, and the scattering-loss-structure portion has at least one opposing end that is disposed in the circumferential direction of the resonator in at least the portion opposing to a main current path of a laser.

A surface-emitting semiconductor laser according to an embodiment includes a vertical direction resonator that is formed by disposing the first and second DBRs with an active layer in between, in which in the outer circumferential portion of a resonator around at least the main current path of the laser, a low refractive-index region which is made by a cavity that has at least one opposing end or by filling material of low refractive-index up in the cavity which is disposed in the circumferential direction, and the cross section, intersecting the current flow direction of the main electric path, of the above plural opposing ends of the low refractive-index region is tapered in the direction toward the center of a main current path of a laser.

Further, a surface-emitting semiconductor laser according to an embodiment includes a number of opposing ends that are provided at intervals and that are disposed approximately on concentric circles with respect to the center axis of the above main current path.

Further, a semiconductor laser according to an embodiment includes a number of opposing ends that are provided at intervals and that are disposed at regular intervals.

Further, a surface-emitting semiconductor laser according to an embodiment has an extended portion that extends in the outer circumferential direction of laser from at least one of opposing ends, and the extending portion is separately provided, or a part thereof located next to each other or all of the extended portions are connected to each other.

Further, a surface-emitting semiconductor laser according to an embodiment has at least three opposing ends.

Further, a surface-emitting semiconductor laser according to an embodiment includes the scattering-loss-structure portion and a low refractive-index region whose depth is selected not to reach the active layer at least at the opposing end opposing to the main current path of the laser.

Further, a surface-emitting semiconductor laser according to an embodiment includes the low refractive-index region in which at least a part of the side surface is made uneven of a wavy or rough surface.

Further, a surface-emitting semiconductor laser according to an embodiment includes the scattering-loss-structure portion or the low refractive-index region in which the shape of the opposing end has the width in a vertical section becoming wider with going away from an active layer.

Further, a surface-emitting semiconductor laser according to an embodiment includes the scattering-loss-structure portion or the low refractive-index region in which the shape of the opposing end has the distance gradually changing with respect to the main current path with going away from the active layer.

Further, a surface-emitting semiconductor laser according to an embodiment includes the scattering-loss-structure portions or the low refractive-index regions, in which at least one interval therebetween is selected such that the intensity distribution of an output light at the time of laser oscillation has one maximum value in the region between the scattering-loss-structure portions or the low refractive-index regions.

Further, a surface-emitting semiconductor laser according to an embodiment includes an oxide-contraction layer, which has an oxide-contraction opening that selects a main current path of the laser, is provided between the first DBR or the second DBR and an active layer, and the opposing end of a refractive-index region is disposed inside the oxide-contraction opening.

Further, a surface-emitting semiconductor laser according to an embodiment includes an oxide-contraction layer which has an oxide-contraction opening that selects a main current path of the laser, is provided between an active layer and the first DBR or the second DBR, and the oxide-contraction opening is approximately ring-shaped, surrounding the center of a resonator.

Further, a method for manufacturing a surface-emitting semiconductor laser according to an embodiment is the method for manufacturing a surface-emitting semiconductor laser having a vertical direction resonator that is formed by disposing the first and second DBRs with an active layer in between, at least including the steps of: forming on a substrate at least the first DBR, a first clad layer, the active layer, a second clad layer and the second DBR; forming on the outer circumferential portion of a resonator a scattering-loss-structure portion which has at least one opposing end that opposes to a main current path to cause a scattering loss; removing the outside of the outer circumferential portion of a resonator by etching to the depth which reaches at least to the first DBR; forming the center hole in the center portion of the resonator; and selectively oxidizing from the outside side-surface of the outer circumferential portion of a resonator and from the center hole in the lower part of the first clad layer or the upper part of the second clad layer.

Further, a method for manufacturing a surface-emitting semiconductor laser according to an embodiment is the surface-emitting semiconductor laser having a vertical direction resonator that is formed by disposing the first and second DBRs with an active layer in between, at least including the steps of: forming on a substrate the first DBR, a first clad layer, the active layer, a second clad layer and the second DBR; forming in the outer circumferential portion of a resonator a cavity or a low refractive-index region which is made by filling material of low refractive-index up in a cavity, which has at least one opposing end that opposes to a main current path; removing the outside of the outer circumferential portion of a resonator by etching to the depth which reaches at least the first DBR; forming the center hole in the center portion of the resonator; and selectively oxidizing from the outside side surface of the outer circumferential portion of a resonator and from the center hole in the lower part of the first clad layer or the upper part of the second clad layer.

Further, an optical device according to an embodiment includes a light-source device having a surface-emitting semiconductor laser including a vertical direction resonator formed by disposing the first and second DBRs with an active layer in between, in which a scattering-loss-structure portion that makes a scattering-loss generated is disposed on the outer circumferential portion of a resonator, and the scattering-loss-structure portion has a plurality of opposing ends which are disposed at intervals in the circumferential direction at least in the portion opposing to a main current path of the laser.

Further, an optical device according to an embodiment includes a light-source device having a surface-emitting semiconductor laser including a vertical direction resonator formed by disposing the first and second DBRs with an active layer in between, in which a cavity or a low refractive-index region made by filling material of low refractive-index up in a cavity, which has a plurality of opposing ends provided at intervals in the circumferential direction around a main current path of the laser, is disposed in the outer circumferential portion of the resonator, and the shape of section of a plurality of opposing ends, intersecting the direction of a current flow of a main current path, of the low refractive-index region is made tapered in the direction toward the center of a main current path of the laser.

According to the above-described surface-emitting semiconductor laser including the structure in an embodiment, high power output surface-emitting semiconductor laser with the single horizontal mode is obtained.

It is assumed that in a conventional surface-emitting semiconductor laser, a basic mode in the center portion of the emitting surface and a high order mode in the outer circumferential portion locally exist; and therefore if the portion having a structure in which scattering-loss occurs is provided in the outer circumferential portion, the single-mode can be obtained because the scattering-loss becomes large with respect to the high order mode.

Accordingly, when the structure in which a low refractive-index region is disposed in a main current path, specifically in the vicinity of a cavity structure portion is employed, light is confined in the center portion and an efficiency of light-emission is enhanced due to the decease of a mean value of refractive-index occurred by the existence of a low refractive-index region disposed therein. Further, since the low refractive-index region is disposed at intervals and a tip thereof is made to be an acute angle, confinement is not strict, so that the leakage of light to the circumference can be made somewhat high and a light-emission area becomes large to obtain high power output. In addition, the scattering-loss of light on the side surface of a low refractive-index region, that is, on an interface, is large; and particularly when the uneven surface of a wavy surface or a rough surface is formed on the side surface (interface), the light-emission loss becomes noticeable, and the loss of the light-emission laser of a high order mode which locally exists in the above-described outer circumference is considerable, so that a favorable single-mode semiconductor laser can be obtained.

Specifically, according to an embodiment, it is assumed that the phenomenon different from the photonics crystal effect occurs and a semiconductor laser of the single horizontal mode is obtained with a large current and a high output.

Furthermore, in a surface-emitting semiconductor laser according to an embodiment, at least one interval between scattering-loss-structure portions or a low refractive-index regions is selected such that the distribution of the strength of output light in the laser oscillation has one maximum value in the region between the scattering-loss-structure portions or low refractive-index regions, so that the improvement in the singularity of horizontal mode can be obtained, as later on described in detail in the description of the preferred embodiments.

Furthermore, in a surface-emitting semiconductor laser according to an embodiment, an oxide-contraction layer which has the oxide-contraction opening to select a main current path of the laser is provided between an active layer and the first DBR or the second DBR, and the oxide-contraction opening is constructed approximately ring-shaped, surrounding the center portion of a resonator, which can realize a low threshold value of current.

Moreover, according to a method for manufacturing a surface-emitting semiconductor laser in an embodiment, the surface-emitting semiconductor laser which has a ring-shaped oxide-contraction opening to realize the above-described low threshold value of current can be manufactured easily and reliably.

Further, an optical device according to an embodiment includes a light-source unit or a light-source device composed of the above described semiconductor laser of a large current, high power output and single horizontal mode of the present invention, so that a optical device can be obtained in which an optical pick-up device for an optical recording medium performs high speed recording and reproduction, for example.

Additional features and advantages of the present invention are described in, and will be apparent from, the following Detailed Description of the Invention and the figures.

DETAILED DESCRIPTION OF THE INVENTION

The present invention relates to a surface-emitting semiconductor laser and a method for manufacturing thereof as well as an optical device including a light-source device in which the surface-emitting semiconductor laser is used. In particular, the present invention relates to a surface-emitting semiconductor laser in which expansion of the mode-field diameter allows for an increase in output with maintaining a single horizontal mode and a method for manufacturing thereof as well as an optical device.

Various embodiments of a surface-emitting semiconductor laser and an optical device including a light-source device composed of a surface-emitting semiconductor laser will be described below as an illustrative example of the present invention and not limitative to the scope thereof.

An example of an embodiment of the surface-emitting semiconductor laser is explained below referring to FIGS. 1 to 4.

Figure 1:
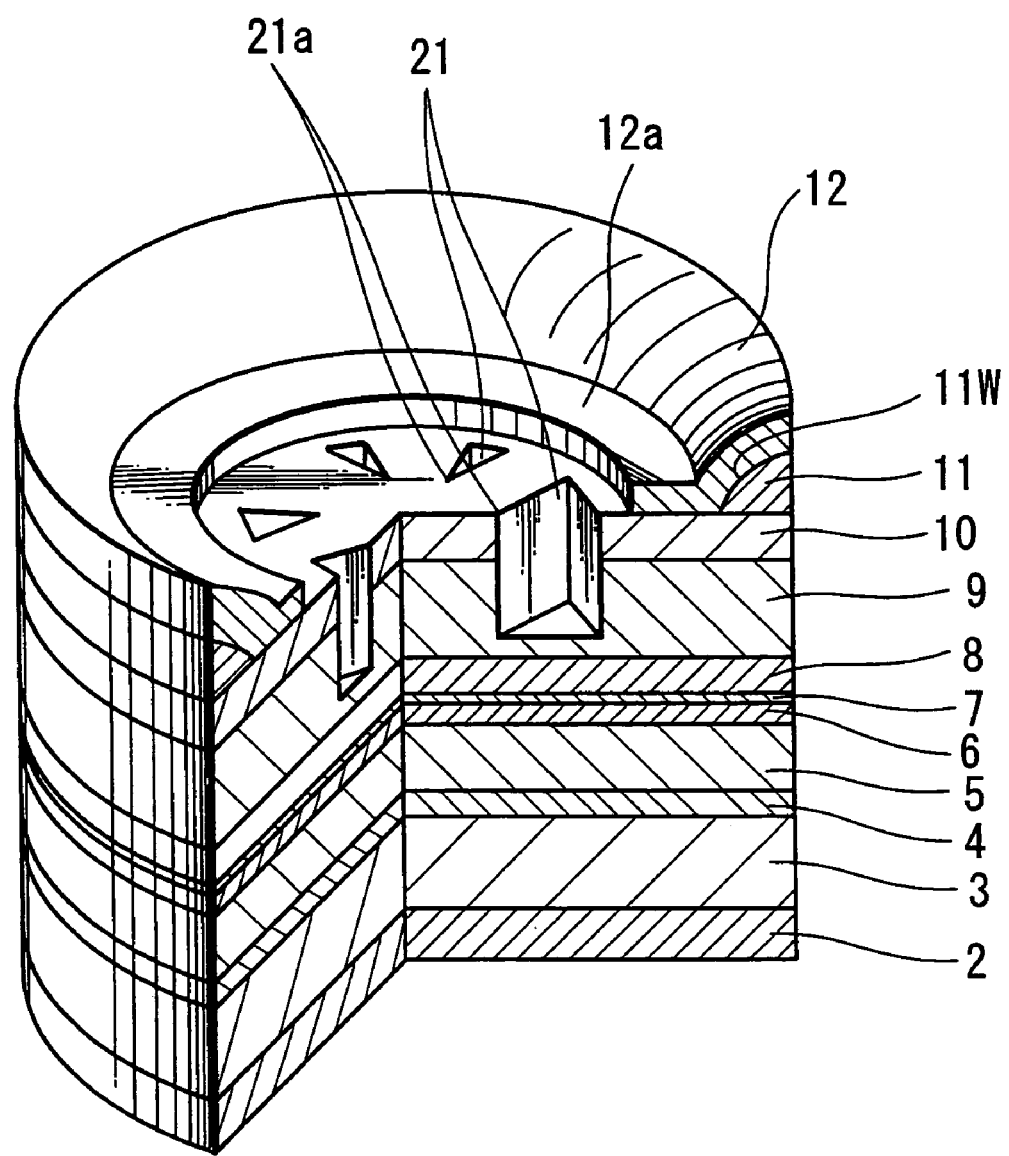
FIG. 1 is a schematic perspective view showing an example of the structure of a surface-emitting semiconductor laser according to an embodiment.

FIG. 1 is a schematic perspective view showing the surface-emitting semiconductor laser according to an embodiment, with a part shown in a sectional manner.

In a surface-emitting semiconductor laser 1 according to an embodiment, a buffer layer 4 when needed, a first DBR 5, a first clad layer 6, an active layer 7, a second clad layer 8 and a second DBR 9, and a cap layer 10 are sequentially formed by, for example, continuous-epitaxy on a substrate 3.

A first electrode 2 is ohmic-contacted on the rear surface of the substrate 3 and an insulating film 11 made of for example $SiO_2$ is formed on the cap layer 10 in a ring-shaped pattern to form a second electrode 12 which has a ring portion 12a that is ohmic-contacted with the cap layer 10 through an opening portion 11w formed in the center of the insulating film 11.

A vertical type resonator is formed between the first DBR 5 and the second DBR 9, and a main current path is formed in the portion between the first electrode 2 and the second electrode 12 opposed to each other, namely under the ring portion 12a of the second electrode 12 within the opening portion 11w.

The first electrode 2 is formed of a multi-layer film composed of, for example, gold/gold-germanium-alloy/gold (Au/AuGe/Au) and the like. The second electrode 12 and ring portion 12a are each formed of a multi-layer film composed of, for example, titan/platinum/gold (Ti/Pt/Au) and the like, where these are formed by deposition, sputtering or the like, respectively.

Further, the substrate 3 is composed of a first conduction-type, for example, n-type GaAs, the buffer layer 4 is composed of GaAs for example, the first DBR 5 is composed of AlGaAs for example of a laminated layer, the first clad layer 6 is composed of ALGaAs for example, the active layer 7 is composed of a laminated layer of AlGaAs and GaAs for example, the second clad layer 8 is composed of AlGaAs for example, the second DBR 9 is composed of a laminated layer of AlGaAs for example, and the cap layer 10 is composed of a second conduction-type, here p-type GaAs, for example.

Then, a scattering-loss-structure portion, a low refractive-index region, or a scattering-loss-structure portion composed of a low refractive-index region is disposed on the outer circumferential portion of the above described resonator. The scattering-loss-structure portion or low refractive-index region is selected at a depth in which at least the opposing end 21a that opposes to the center portion of a main current path never reaches the active layer 7. The scattering-loss-structure portion can include, other than being composed of a low refractive-index region, a low refractive-index region formed by selectively performing ion implantation for example to partially increase electric resistance.

Further, the shape in the cross section of the low refractive-index region 21 that intersects the current flow direction of a main current path in a surface-emitting semiconductor laser has an tapered acute angle in the direction toward the center of a resonator and can be formed for example by the above selective ion-implantation or photo lithography technology and the reactive ion-etching, for example.

In an embodiment, a low refractive-index region 21, a cavity for example, penetrates the cap layer 10, and is formed within the second DBR 9 and the second clad layer 8; however, in order to obtain both the effectiveness of a gentle confinement of light and scattering of high-order mode light, it is desirable that three or more low refractive-index region 21 each having an opposing end be provided at intervals in the same surface, namely in the circumferential direction of a resonator.

Further, in an embodiment, when the relationship between an angle at a opposing end constituting a low refractive-index region, that is, a tapered acute angle and the scattering-loss of the high-order-mode light was measured and the results are obtained, scattering-loss of the high-order-mode light was noticeable in the range of $\tan(\theta/2)=(0.25/2)$ to $(0.75/2)$, specifically $\theta=14.3$ to $41.1$ [deg], when the angle was $\theta$.

With the above construction, the probability of reflection and dispersion of the high-order-mode light which distributes more on the periphery of the surface-emitting semiconductor laser 1 may increase by a low refractive-index region 21 disposed on the outer circumferential portion, so that the probability of light returning to the center portion of a surface-emitting semiconductor laser 1 can also be reduced.

Figure 2A:
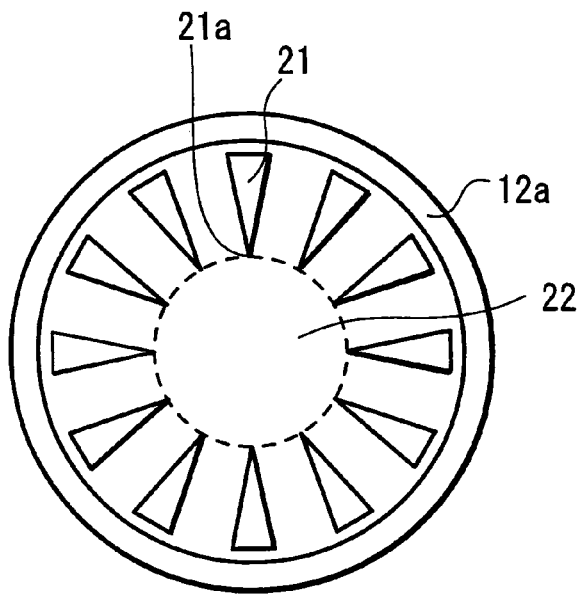
FIGS. 2A to 2C are schematic top views respectively showing dispositional relationships between an electrode and a low refractive-index region in a surface-emitting semiconductor laser according to an embodiment.
Figure 2B:
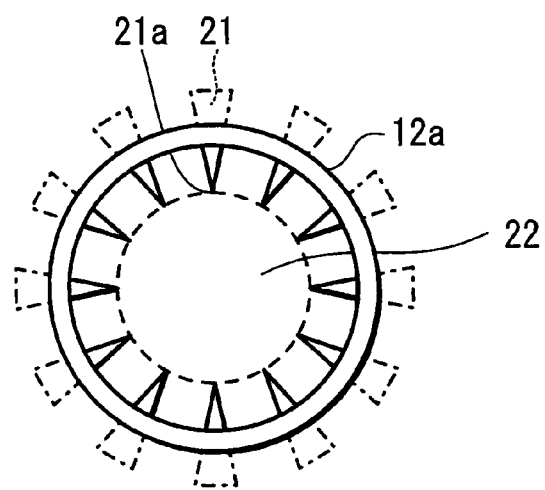
Figure 2C:
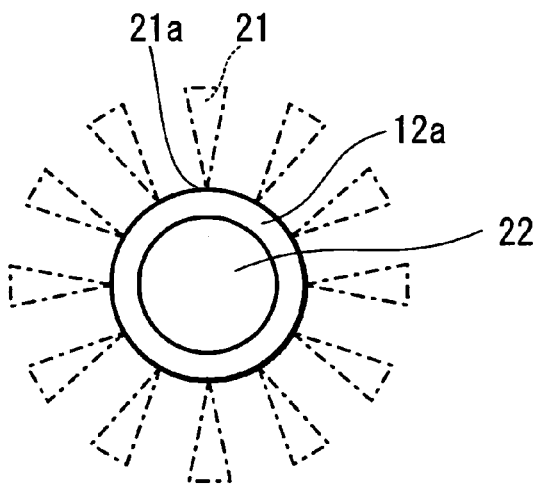

FIGS. 2A to 2C are schematic views showing the dispositional relationship between the ring portion 12a of the electrode 12 and the low refractive-index region 21. In FIG. 1, the ring portion 12a of the electrode 12, as shown in the FIG. 2A, is disposed on the upper surface on the outer circumferential side of a plurality of low refractive-index regions 21 disposed around a main current path, that is, around the current path center portion 22 in the surface-emitting semiconductor laser 1; however, the ring portion 12a is not necessarily provided on the outer circumferential side, and for example the structure in which at least a part of the current path center portion 22 is exposed and the ring portion 12a is disposed to cross directly on top of a low refractive-index region 21 as shown in FIG. 2B or the structure in which the ring portion is disposed on the upper surface of the inner circumference side of a low refractive-index region 21 as shown in FIG. 2C can also be considered.

FIGS. 3A to 3D are schematic views showing the modified example of the arrangement and shape of a low refractive-index region of a surface-emitting semiconductor laser according to an embodiment.

Figure 3A:
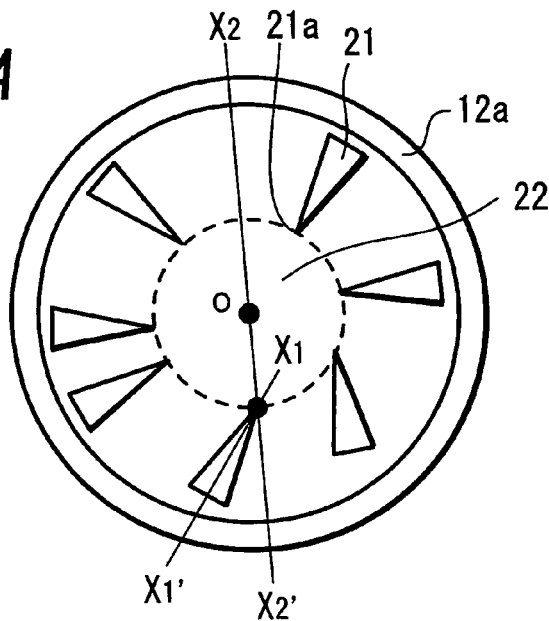
FIGS. 3A to 3D are schematic views respectively showing an example of a shape or a dispositional relationship of a low refractive-index region or a scattering-loss-structure portion composed of a low refractive-index region of a surface-emitting semiconductor laser according to an embodiment.

In a surface-emitting semiconductor laser according to an embodiment, the shape or arrangement of a plurality of low refractive-index regions 21 that are formed at intervals, need not necessarily have an ordinality such as a rotational symmetry, and as shown in FIG. 3A for example, as long as it is formed with a tapered acute angle pattern in the direction toward the internal circumference side, namely toward the center of a current path, the intervals between each other in the circumferential direction are not required to be constant.

Further each of a number of low refractive-index regions 21 may have a different shape and a cross-sectional area, so that the cross section thereof may not the same with each other.

Further, a straight line $X_1$-$X_1$ which divides equally an acute angle of a low refractive-index region 21, and a straight line $X_2$-$X_2$ which passes through a point which forms an acute angle and the center O of the current path center portion 22 are not necessarily required to coincide.

Figure 3B:
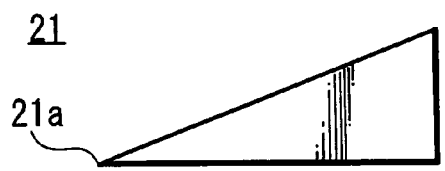
Figure 3C:
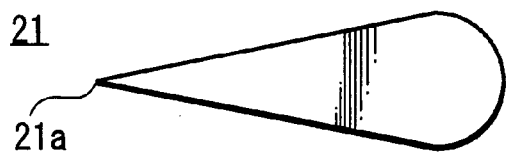

Further, the shape of a cross section that intersects the current flow direction of an current path of the low refractive-index region 21 is not limited to so-called an isosceles triangle, and as shown in FIG. 3B, the shape can be either the acute-angle triangle or a so-called right-angle triangle, or as shown in FIG. 3C, the shape can be the one in which the side surface of an extending portion that contacts the outside in the circumferential direction has a curved surface, seeing from the center portion of a current path.

Figure 3D:
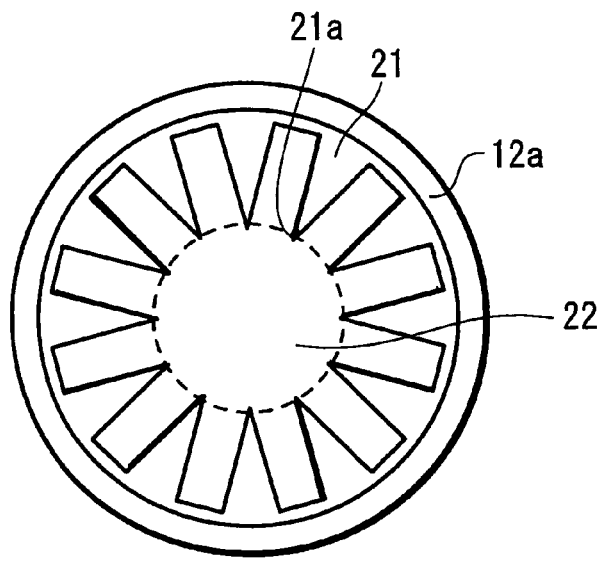

Furthermore, in a surface-emitting semiconductor laser according to an embodiment, the structure of a number of low refractive-index regions 21 is not limited to the case in which the regions are provided separately and independently from each other, and as shown in FIG. 3D a structure in which an extended portion in the outer circumferential direction is connected to each other can be employed.

FIG. 4 is a schematic perspective view showing an example of the shape of a side surface of a low refractive-index region in the surface-emitting semiconductor laser according to an embodiment.

Figure 4A:
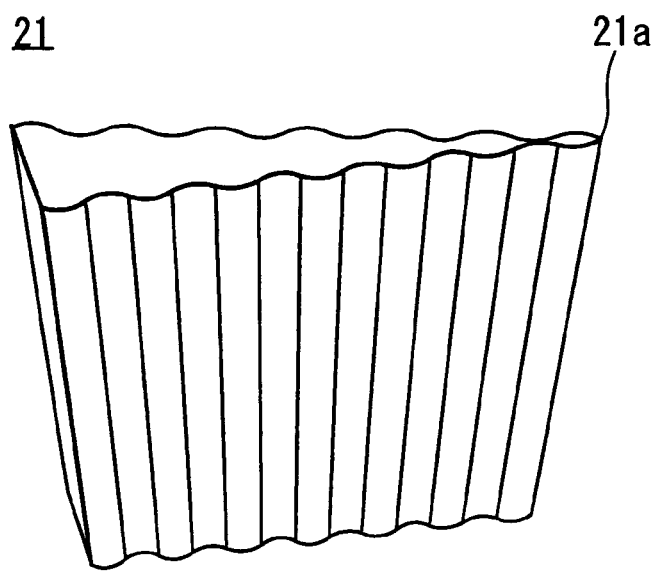
FIGS. 4A and 4B are schematic perspective views respectively showing an example of the condition of the side surface of a low refractive-index region in a surface-emitting semiconductor laser according to an embodiment.
Figure 4B:
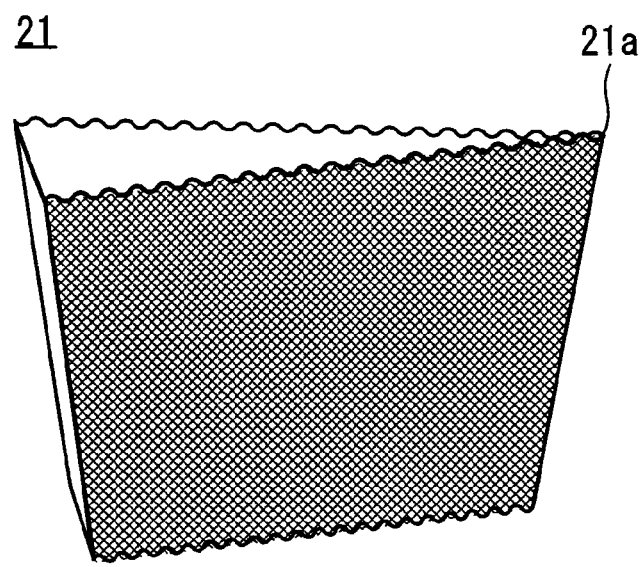

In the surface-emitting semiconductor laser 1 according to an embodiment, at least a part of a side surface of the low refractive-index region 21 can be formed as an uneven surface of a wavy surface or rough surface, and examples thereof are explained referring to a schematic perspective views of FIGS. 4A and 4B.

Specifically, when forming a low refractive-index region 21, a minute change in an angle is provided along the current flow direction of a main current path in the surface-emitting semiconductor laser 1. For example, by forming a wavy surface of zigzag as shown in the perspective view of FIG. 4A or by forming an uneven surface of the random rough surface or the like shown in the perspective view of FIG. 4B, the scattering-loss in the scattering-loss structure portion formed with a number of low refractive-index regions 21 is made large with respect to the high-order-mode light that exists in the outer circumferential portion of a surface-emitting semiconductor laser 1.

This uneven surface can be formed, for example, by controlling conditions of a gas pressure, supplied electric power, temperature of a substrate and the like when the reactive ion-etching is performed to form a cavity.

An embodiment of the surface-emitting semiconductor laser will be explained below referring to FIGS. 5 to 7.

Figure 5A:
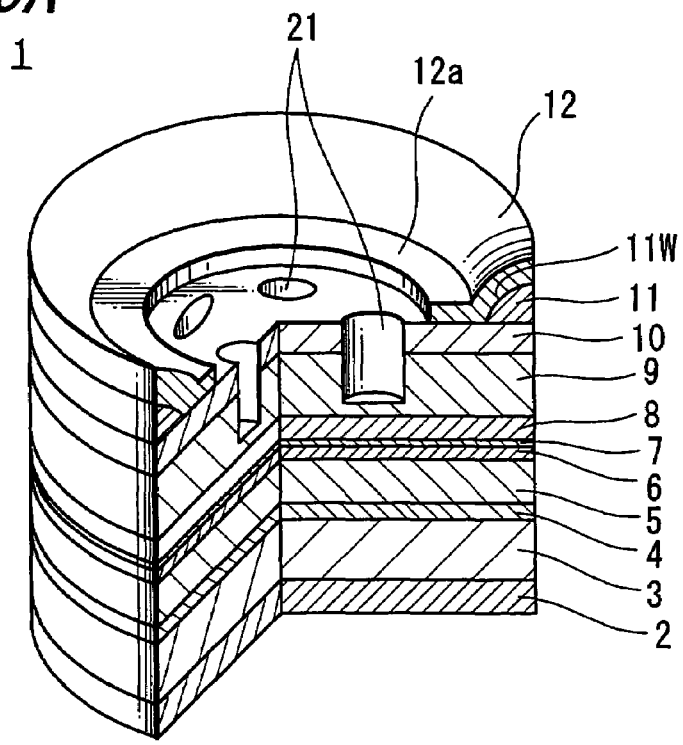
FIGS. 5A and 5B are schematic perspective views respectively showing an example of the structure and the shape of a surface-emitting semiconductor laser according to an embodiment.
Figure 5B:
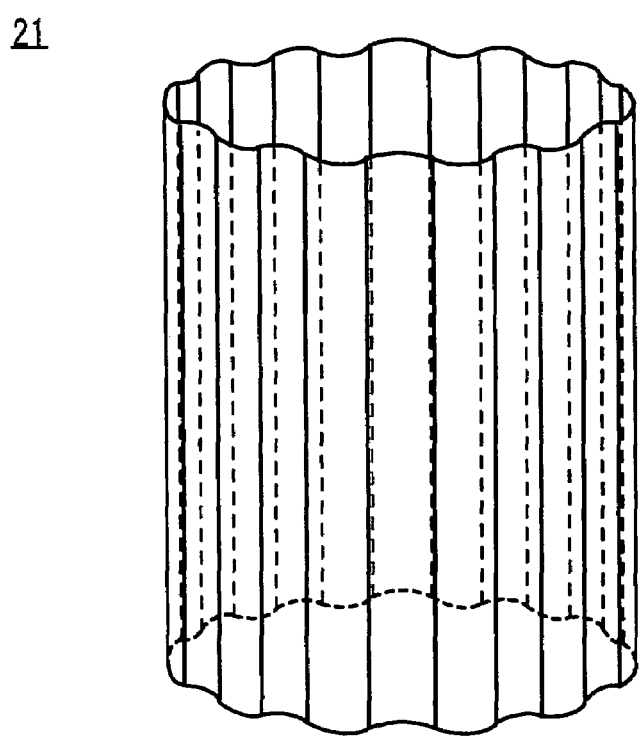

FIG. 5A is a schematic perspective view showing a surface-emitting semiconductor laser 1 with a part shown in a sectional manner.

In the surface-emitting semiconductor laser 1, a buffer layer 4 when needed, a first DBR 5, a first clad layer 6, an active layer 7, a second clad layer 8 and a second DBR 9, and a cap layer 10 are sequentially formed by, for example, continuous-epitaxy on a substrate 3.

A first electrode 2 is ohmic-contacted on the rear surface of the substrate 3 and an insulating film 11 made of for example SiO$_2$ is formed on the cap layer 10 in a ring-shaped pattern to form a second electrode 12 which has a ring portion 12a that is ohmic-contacted with the cap layer 10 through an opening portion 11w formed in the center of the insulating film 11.

A vertical type resonator is formed between the first DBR 5 and the second DBR 9, and a main current path is formed in the portion between the first electrode 2 and the second electrode 12 opposed to each other, namely under the ring portion 1 2a of the second electrode 12 within the opening portion 11w.

The first electrode 2 is formed of a multi-layer film composed of gold/gold-germanium-alloy/gold (Au/AuGe/Au) for example, the second electrode 12 and ring portion 12a are each formed of a multi-layer film composed of titan/platinum/gold (Ti/Pt/Au) for example, and these are formed by deposition, sputtering or the like, respectively.

Further, the substrate 3 is composed of a first conduction-type, for example, n-type GaAs, the buffer layer 4 is composed of GaAs for example, the first DBR 5 is composed of AlGaAs for example of a laminated layer, the first clad layer 6 is composed of ALGaAs for example, the active layer 7 is composed of a laminated layer of AlGaAs and GaAs for example, the second clad layer 8 is composed of AlGaAs for example, the second DBR 9 is composed of a laminated layer of AlGaAs for example, and the cap layer 10 is composed of a second conduction-type, here p-type GaAs, for example.

Then, a scattering-loss-structure portion, a low refractive-index region, or a scattering-loss-structure portion composed of a low refractive-index region is disposed on the outer circumferential portion of the above-described resonator. The scattering-loss-structure portion or low refractive-index region is selected to be provided in the depth in which at least a part thereof never reaches the active layer 7 constituting the resonator.

Further, a number of, for example three or more, low refractive-index regions 21, cavities for example, penetrate a cap layer 10 and are formed at intervals within the second DBR 9 and the second clad layer 8 for example in the circumferential direction of a resonator.

In an embodiment, the low refractive-index region 21 has the shape of a cross section that intersects the current flow direction of an current path of the surface-emitting semiconductor laser 1 and that is formed by a closed curve, a circular-shape or an elliptic-shape for example, in which a curvature is changed continuously or discontinuously.

Further, in the surface-emitting semiconductor laser according to an embodiment, the structure of a number of low refractive-index regions 21 is not limited to the one in which the regions are provided separately and independently with each other, and an extended portion in the outer circumferential direction can be connected to each other.

In the surface-emitting semiconductor laser 1 according to an embodiment, at least a part of a side surface of the low refractive-index region 21 can be formed as an uneven surface having a wavy surface or rough surface.

Specifically, when forming a low refractive-index region 21, a minute change in an angle is provided along the current flow direction of a main current path in the surface-emitting semiconductor laser 1. For example, by forming a wavy surface of zigzag or by forming an uneven surface of the random rough surface or the like as shown in for example FIG. 5B, the scattering-loss in the scattering-loss structure portion formed of a number of low refractive-index regions 21 is made large with respect to the high-order-mode light that exists in the outer circumferential portion of the surface-emitting semiconductor laser 1.

This uneven surface can be formed, for example, by controlling conditions of a gas pressure, the supplied electric power, a temperature of a substrate and the like when the reactive-ion-etching (RIE) is performed to form a cavity by patterning or etching.

With the above construction, the probability of reflection and dispersion of the high-order-mode light which distributes more on the outer periphery of a surface-emitting semiconductor laser 1 may increase by a low refractive-index region 21 disposed on the outer circumferential portion, so that the probability of light returning to the center portion of the surface-emitting semiconductor laser 1 can also be reduced.

Figure 6A:
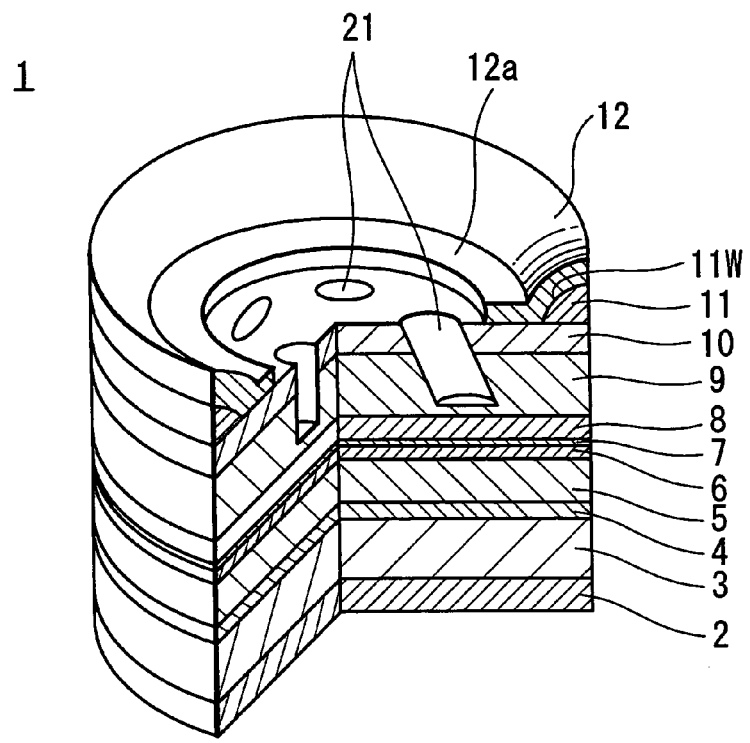
FIGS. 6A to 6C are schematic perspective views respectively showing an example of the structure and the shape of a surface-emitting semiconductor laser according to an embodiment.
Figure 6B:
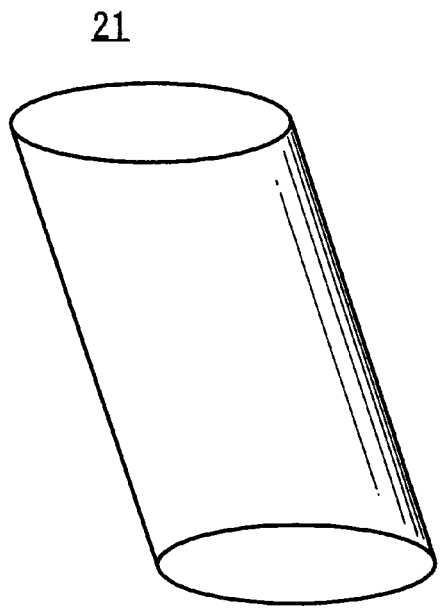

Moreover, in the surface-emitting semiconductor laser according to an embodiment, as shown in FIG. 6A that is a schematic perspective view of an example with a part partly shown in a section, an opposing end of a low refractive-index region 21 with respect to a main current path has a gradually changing distance from a main current path with going away from an active layer. Specifically, as shown in, for example, FIG. 6B that is a schematic perspective view of an example of the low refractive-index region 21, with the structure of a tilted cylindrical-shape that approaches to a main current path with going away from an active layer, the probability that light contacts with the low refractive-index region 21 can be increased, so that scattering-loss of high-order-mode light in a scattering-loss structure portion can be increased. This structure can be obtained by Focused Ion Beam Etching (FIB), for example.

Figure 6C:
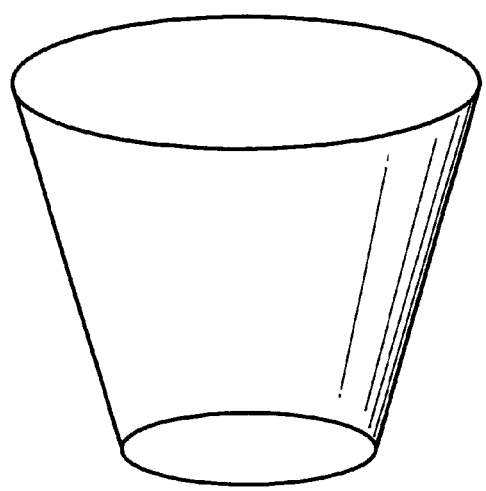

Further, as shown in FIG. 6C, also with the structure in which the lateral-width of the vertical-section of a low refractive-index region 21 becomes large with going away from an active layer 13, the probability that light contacts with a low refractive-index region 21 can be increased, so that scattering-loss of high-order-mode light can be increased. This can be realized, for example, in etching by RIE to form a cavity in the condition of a low gas pressure and high applying power in comparison with the normal time.

As described above, embodiments of a surface-emitting semiconductor laser according to the present invention have been explained; however, the present invention is not limited thereto and various modifications can be made.

For example, in an embodiment of the surface-emitting semiconductor laser, though the n-type is used as the first conduction-type and the p-type is used as the second conduction-type, the p-type can be used as the first conduction-type and the n-type can be used as the second conduction-type.

Figure 7A:
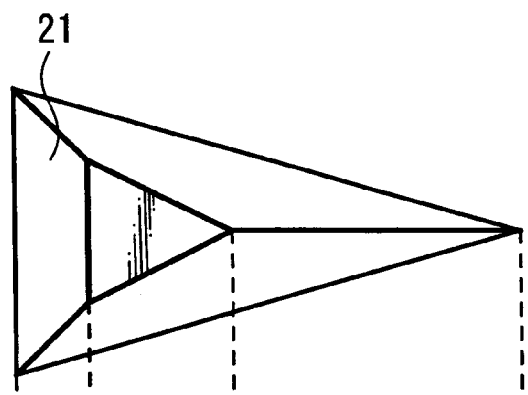
FIGS. 7A and 7B are a schematic top view and a schematic cross-sectional view, respectively showing an example of the shape of a low refractive-index region in a surface-emitting semiconductor laser according to an embodiment.
Figure 7B:
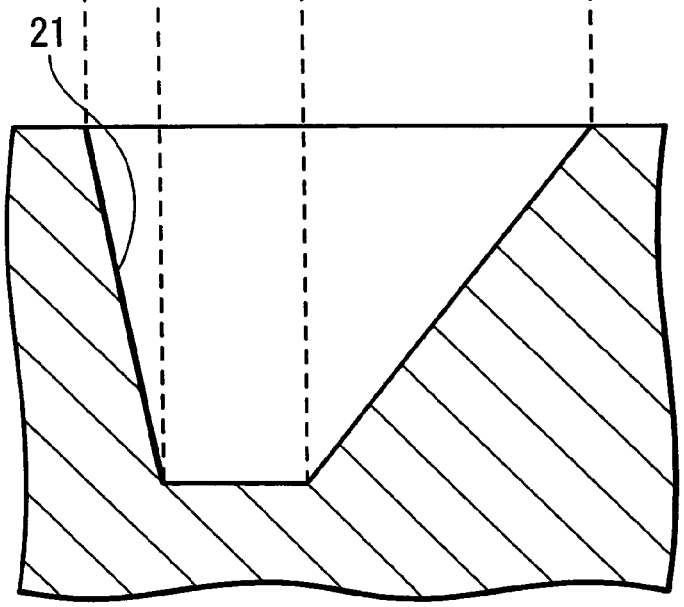

Also, as shown in a perspective top view of FIG. 7A and a perspective view of FIG. 7B indicating the vertical section, a low refractive-index region, a cavity for example, may have a truncated pyramid shape, for example. In other words, when this cavity is formed, an area of the section is made to become small with approaching to an active layer, so that the scattering-loss of the high-order-mode light can be promoted efficiently.

Figure 7C:
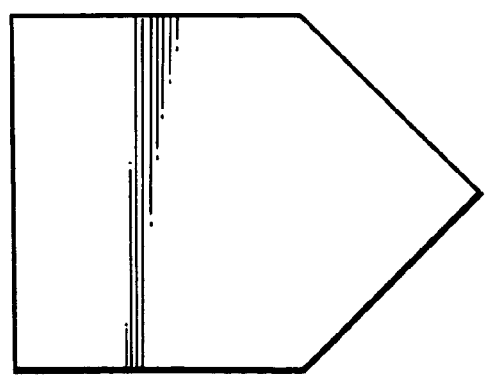
FIG. 7C is a schematic top view showing another example of a low refractive-index region in a surface-emitting semiconductor laser according to an embodiment.

Further, as shown in a schematic top view of FIG. 7C for example, a surface-emitting semiconductor laser according to an embodiment may have the shape in which various polygons form the cross section thereof and various other modified shapes can be obtained.

An embodiment of the surface-emitting semiconductor laser is explained below in greater detail.

Figure 8:
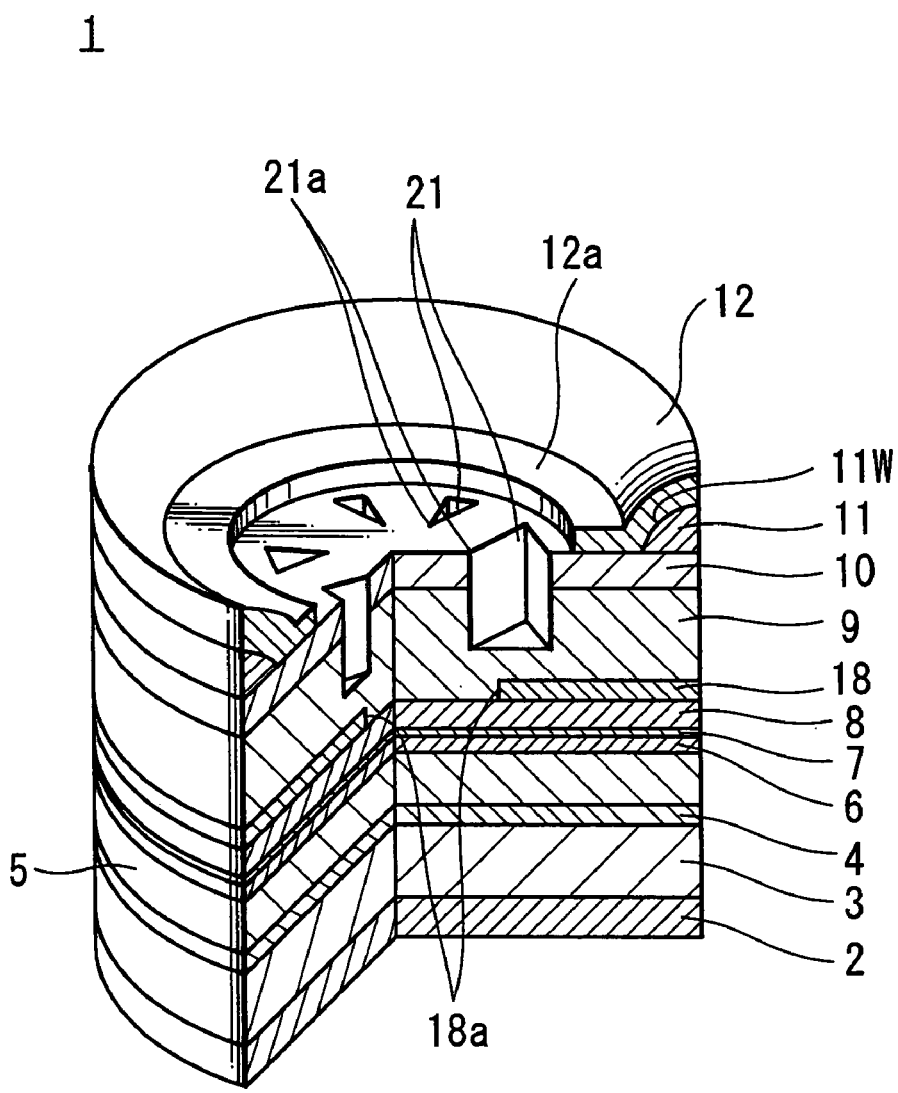
FIG. 8 is a schematic perspective view showing the structure of an example of a surface-emitting semiconductor laser according to an embodiment.

FIG. 8 is a schematic perspective view in which a part of a surface-emitting semiconductor laser 1 is shown in a section. In FIG. 8, the same numerals are given to parts which correspond to those in the FIGS. 1 and 5, and redundant explanation will be omitted.

In an embodiment, an oxide-contraction layer 18 is provided on the second clad layer 8. For example, after each layer is epitaxially grown sequentially, a cylindrical shape constituting a resonator is formed by etching and the oxide-contraction layer 18 can be formed from outside thereof by selective-oxidization, for example. This oxide-contraction layer 18 has a structure in which an oxide-contraction opening 18a is formed in the center portion, that is, in the center portion of a vertical resonator by appropriately selecting the oxidation time, for example.

In an embodiment, a number of, for example three or more, scattering-loss structure portions or low refractive-index regions, in the figure the low refractive-index regions 21, cavities for example, penetrate a cap layer 10, and are formed in the second DBR 9 and the second clad layer 8 at intervals in the circumferential direction of a resonator.

Further, in an embodiment, an interval between the low refractive-index regions 21 is selected such that the intensity distribution of output light at the time of laser oscillation has one maximum value in the region between the low refractive-index regions.

It is noted that a satisfactory single horizontal mode oscillation may not be obtained, when a number of, two or more for example, low refractive-index regions described above are provided and the intervals thereof are too wide. Then, fluctuation in the single horizontal mode was measured by changing an interval of the low refractive-index region.

As described below in an embodiment, the first electrode 2 is formed of a multi-layer film composed of gold/gold-germanium-alloy/gold (Au/AuGe/Au) for example, the second electrode 12 and ring portion 12a are each formed of a multi-layer film composed of titan/platinum/gold (Ti/Pt/Au) for example, and these are formed by deposition, sputtering or the like, respectively.

Further, the substrate 3 is composed of a first conduction-type, for example, n-type GaAs, the buffer layer 4 is composed of GaAs for example, the first DBR 5 is composed of AlGaAs for example of a laminated layer, the first clad layer 6 is composed of ALGaAs for example, the active layer 7 is composed of a laminated layer of AlGaAs and GaAs for example, the second clad layer 8 is composed of AlGaAs for example, the second DBR 9 is composed of a laminated layer of AlGaAs for example, and the cap layer 10 is composed of a second conduction-type, here p-type GaAs, for example.

Then, in an embodiment, an low refractive-index region 21 composed of a hole having an approximately triangle section is formed inside the oxide-contraction opening 18a with the opposing end thereof is disposed on the inside of the oxide-contraction opening 18a.

Figure 9:
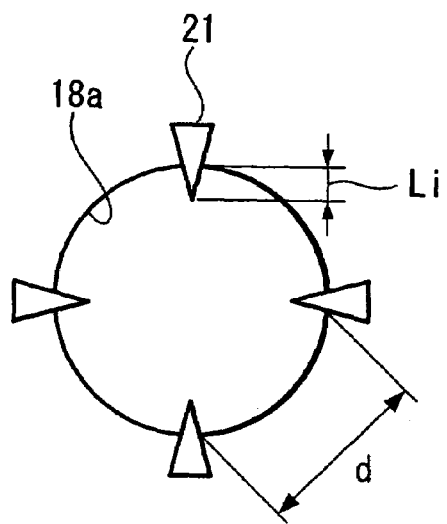
FIG. 9 is a view for explaining intervals between low refractive-index regions of a surface-emitting semiconductor laser according to an embodiment.

Then, as schematically shown in FIG. 9, in the structure of arrangement of the oxide-contraction opening 18a and the low refractive-index region 21 an interval d between the low refractive-index regions 21 is a straight-line distance between the inner points which intersect an oxide-contraction opening 18a. Here, an amount Li entered the oxide-contraction opening 18a of an opposing end of the low refractive-index region 21 is set to approximately 2 μm in the radius direction when the oxide-contraction opening 18a is approximately circle, also the length a in the radius direction of low refractive-index region 21 is set to approximately 5 μm and the side length b on the outer circumferential side is set to approximately 1.25 μm to 3.75 μm With such construction, a number of surface-emitting semiconductor lasers in which the interval d between the low refractive-index regions 21 is changed in the range of 4 μm to 13 μm are made, and the side-mode suppression ratio (SMSR) that is the index indicating a degree of single horizontal mode oscillation from each oscillation spectrum was obtained. The results are shown in FIG. 10.

Figure 10:
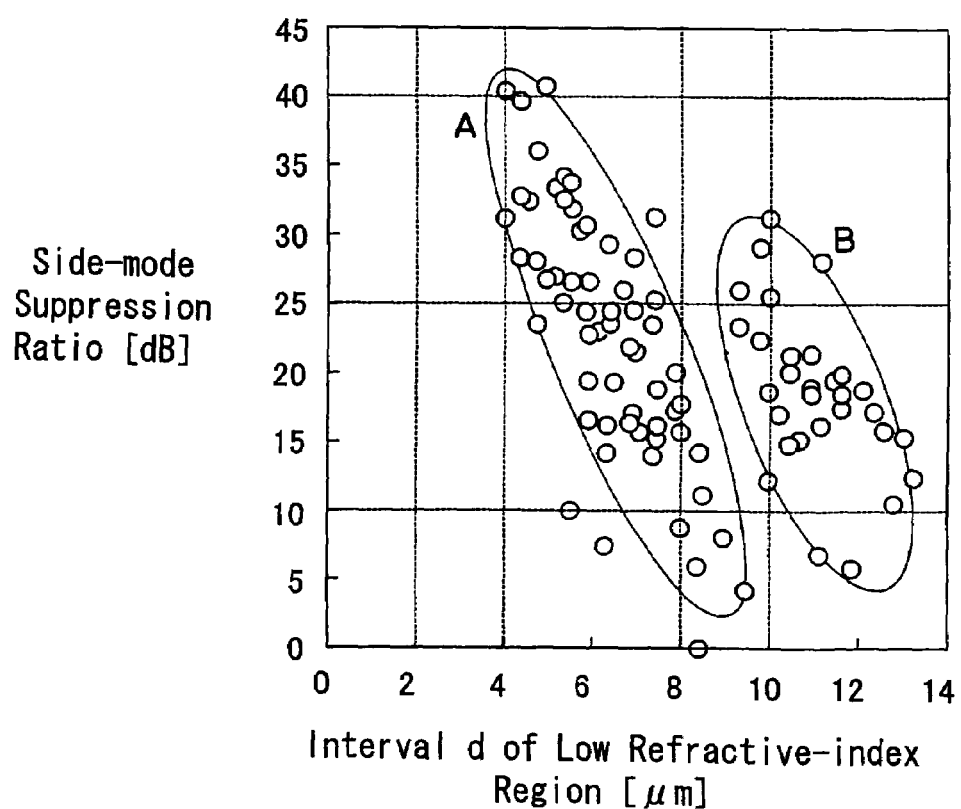
FIG. 10 is a diagram showing the change of the side-mode suppression ratio with respect to an interval of a low refractive-index region of a surface-emitting semiconductor laser according to an embodiment.

As shown in FIG. 10, the distribution of SMSR was divided into two groups; and when a group with comparatively narrow interval d is a group A and a group with comparatively wide interval d is a group B, two kinds of light-emission pattern of laser oscillation are observed regarding those groups.

Figure 11:
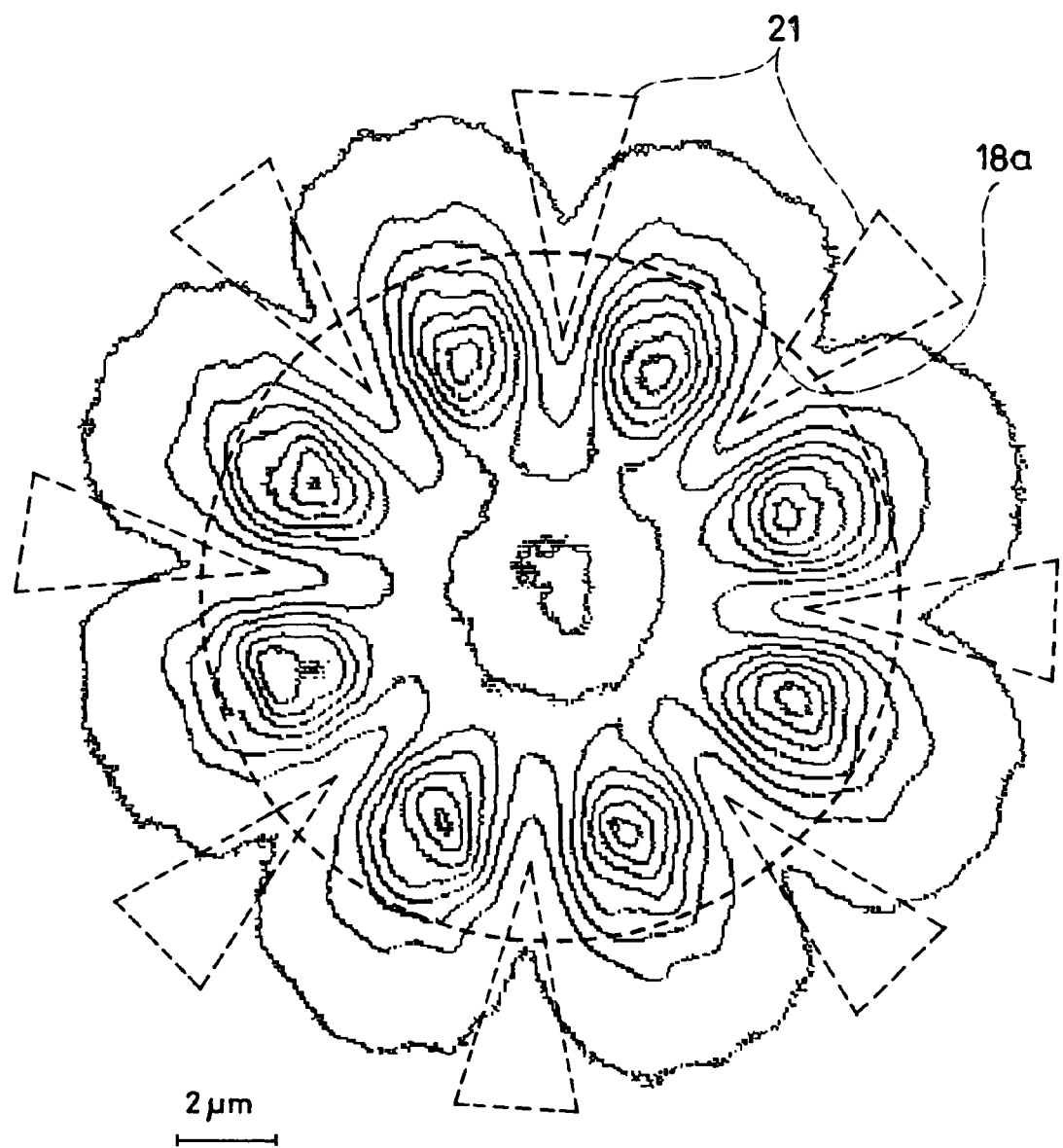
FIG. 11 is a view showing an example of a pattern of light-emission of a semiconductor laser of Group A in FIG. 10.

First, in a semiconductor laser of the group A, as shown in an example of the light-emission pattern (light-emission strength is shown with a contour) in the laser oscillation of FIG. 11, the distribution of the light-emission strength has one maximum value between the low refractive-index regions 21. An example of oscillation spectrum in this case is shown in FIG. 12.

Figure 13:
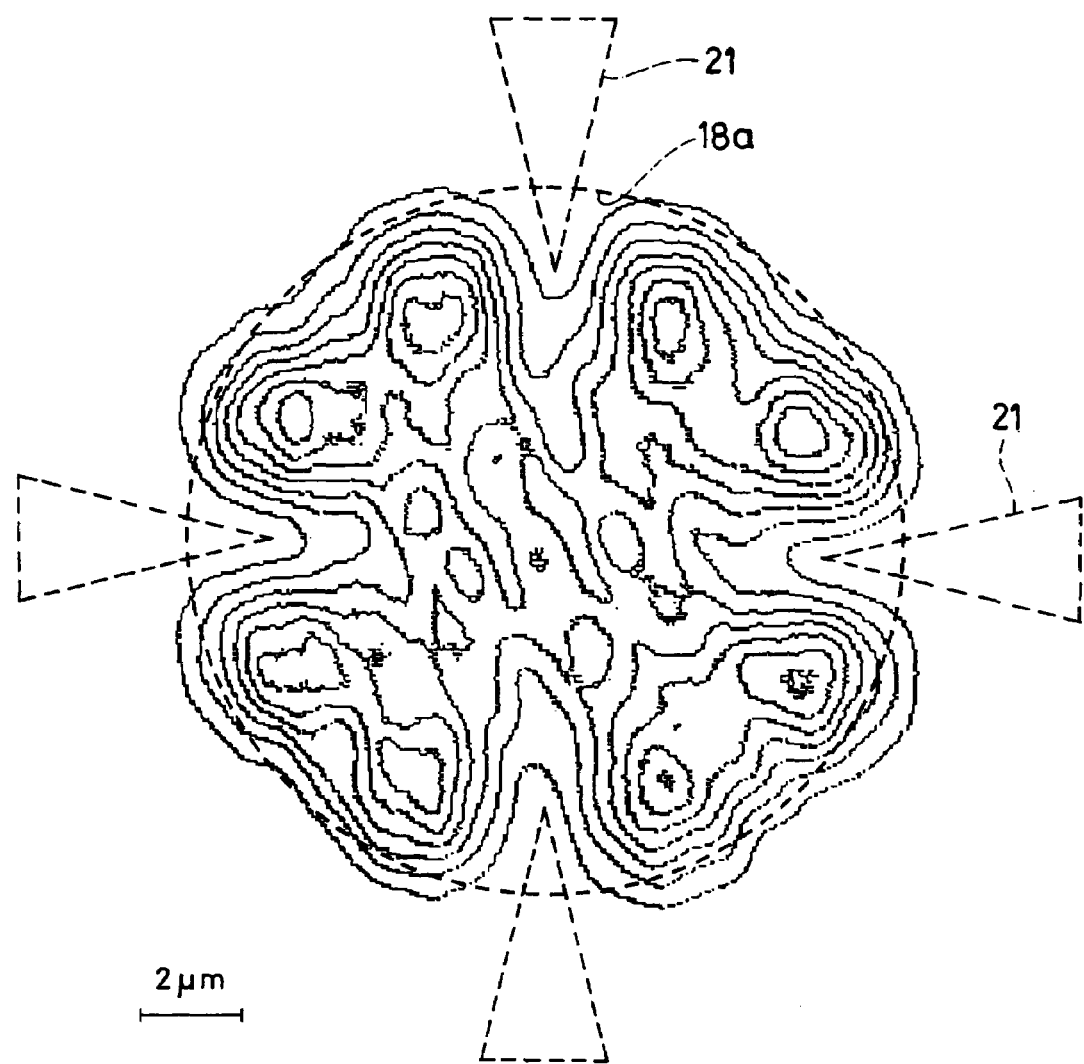
FIG. 13 is a view showing an example of a pattern of light-emission of a semiconductor laser of Group B in FIG. 10.

In the semiconductor laser of the group B, as shown in an example of the light-emission pattern in the laser oscillation of FIG. 13, the light-emission strength between the low refractive-index regions 21 does not have one maximum value, and it is understood that two or more maximum values exist. An example of oscillation spectrum in this case is shown in FIG. 14.

Figure 12:
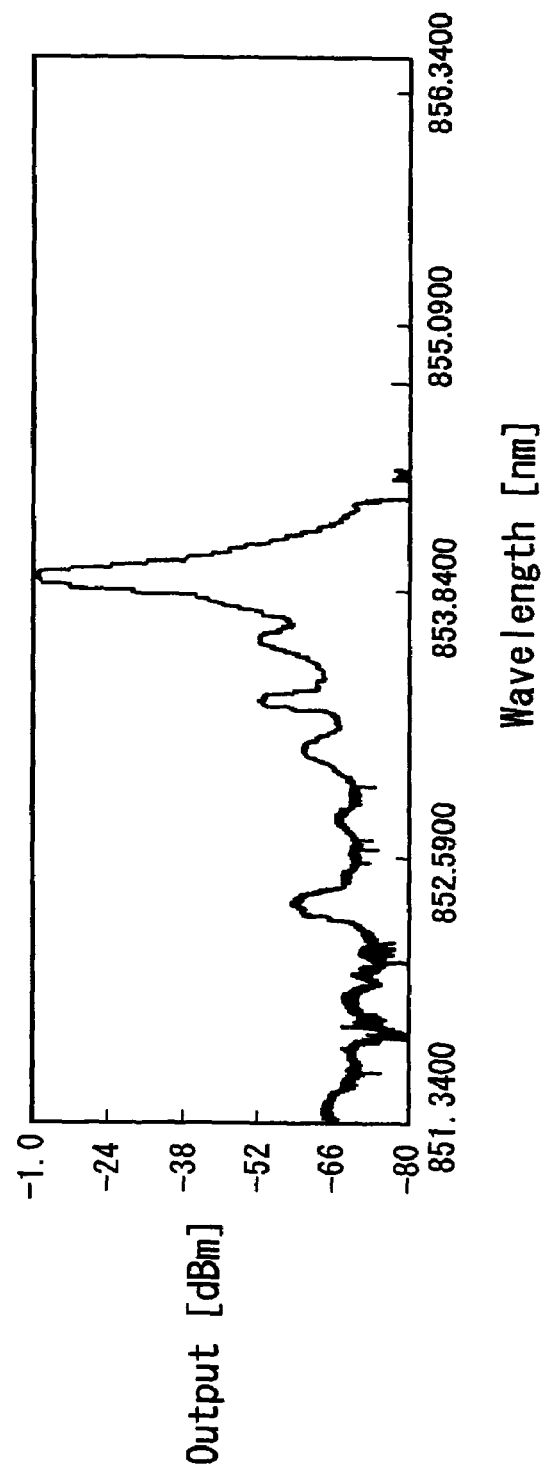
FIG. 12 is a diagram showing an example of an oscillation-spectrum of a semiconductor laser of Group A in FIG. 10.
Figure 14:
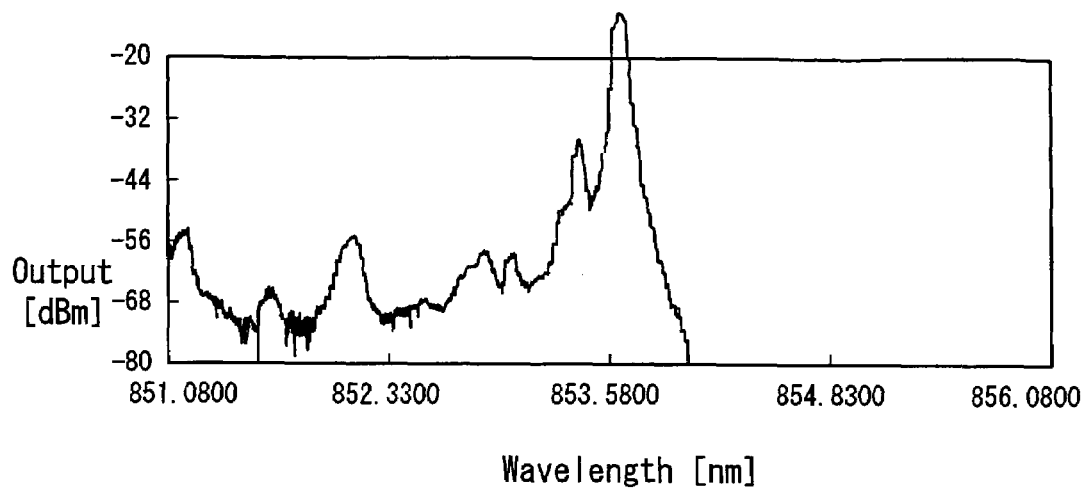
FIG. 14 is a diagram showing an example of an oscillation-spectrum of a semiconductor laser of Group B in FIG. 10.

When those oscillation spectra of FIGS. 12 and 14 are compared, SMSR is more favorable in a surface-emitting semiconductor laser of the group A, and it is understood that an interval d of the group A is suitable for the singularity of the horizontal mode.

Accordingly, portions between the low refractive-index regions 21 are considered to have the similar effectiveness as that of a resonator. Further, a similar phenomenon is considered to occur when a scattering-loss structure portion is provided.

In the above-described structure, AlGaAs is used as an active layer, the oscillation wavelength is 850 nm, and the length of a resonator is designed to be equal to the oscillation wave-length; and a value of the interval d between low refractive-index regions, which becomes a boundary between the group A and the group B, is 9 μm. However, it is predicted that an appropriate value of the interval d varies, for example, in the case where the oscillation wavelength is 1.3 nm when GaInNAs is used as an active layer; in the case where a resonator is designed to have the length slightly different from the oscillation wave-length; in the case where the shape or length of the low refractive-index region is different; and the like.

However, also in those cases, it is assumed from the fundamental concept of the similarity in resonance characters that higher SMSR can easily be obtained by suitably selecting the interval d of a low refractive-index region belonging to the group A which is shown in the above-described FIG. 10.

In an embodiment, when a scattering-loss-structure portion or a low refractive-index region is provided in a surface-emitting semiconductor laser, the interval thereof is selected to be an interval belonging to the group A, namely, is selected to be an interval in which the strength of the output light has one maximum value between the scattering-loss-structure portions or between the low-refractive-index regions.

Further, in the above-described example, an oxide-contraction layer was provided to make a light-emission region small; and the oxide-contraction layer may be provided in the upper portion of the second clad layer as described in the above embodiments or may be provided in the lower portion of the first clad layer.

Furthermore, at that time, the singularity of the horizontal-mode can further be improved by disposing the opposing end of the low refractive index region inside the oxide-contraction opening. In the case where the opposing end is disposed at the end of the oxide-contraction-opening or on the outside thereof, there is a possibility that the scattering of the high-order-mode light is not sufficient.

As described above, in a surface-emitting semiconductor laser according to an embodiment, by suitably selecting the interval of the low refractive-index regions, higher SMSR can be obtained and the singularity of the mode can be improved, so that the surface-emitting semiconductor laser can be used as a light-source for the optical-fiber communication of a longer distance and higher data transmission rate.

An embodiment of the surface-emitting semiconductor laser is explained below in greater detail.

Figure 15:
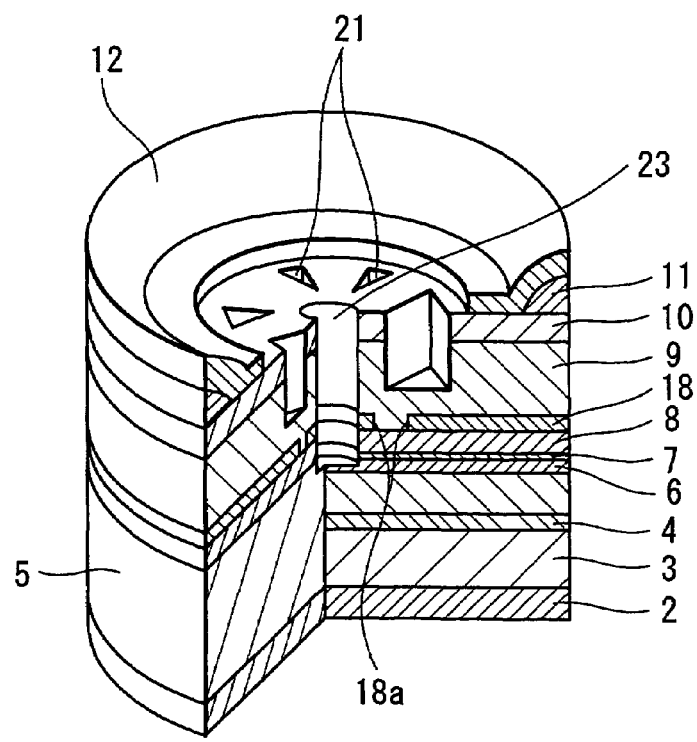
FIG. 15 is a schematic perspective view showing an example of the structure of a surface-emitting semiconductor laser according to an embodiment of the present invention.

FIG. 15 is a schematic perspective view showing the surface-emitting semiconductor laser 1 with a part thereof shown in a section. In FIG. 15, the same numerals are given to parts which correspond to those of FIGS. 1 and 5, and a redundant explanation thereof is omitted.

In an embodiment, an oxide-contraction layer 18 having an oxide-contraction opening 18a that selects a main current path of a laser is provided between an active layer and the first DBR or the second DBR, and this oxide-contraction opening 18a is approximately ring-shaped, surrounding the center of a resonator. A surface-emitting semiconductor laser having such structure can be formed by a method for manufacturing a surface-emitting semiconductor laser according to the present invention.

Specifically, in an embodiment, the case is shown in which a center hole 22 having the depth that penetrates the oxide-contraction layer 18, that is, the depth that reaches to an active layer in the figure is provided in the center portion of a resonator. With this construction, the oxide-contraction layer 18 can be formed from the outside and from the center hole 22 by the selective-oxidization.

Figure 16A:
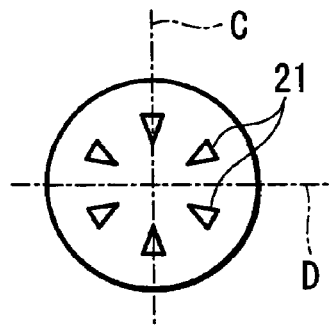
FIGS. 16A to 16D are process diagrams showing an example of a method for manufacturing a surface-emitting semiconductor laser according to an embodiment of the present invention.
Figure 16B:
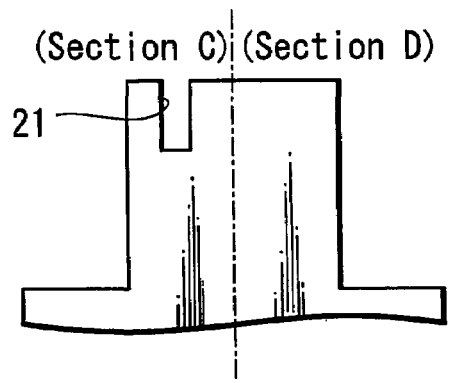
Figure 16C:
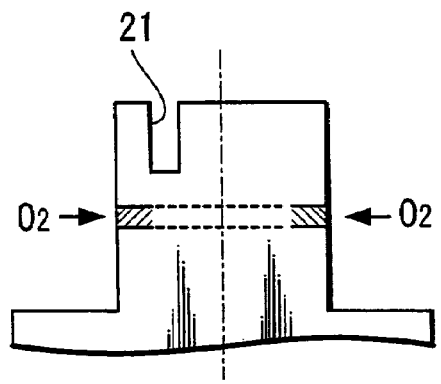

For example, in the case where a conventional surface-emitting semiconductor laser having an oxide-contraction opening of an approximately circular section is formed, as shown in the sectional structure of FIG. 16A; when a low refractive-index region 21 composed of a hole on a triangle in a section exists in a vertical section C and a low refractive-index region 21 does not exist in a vertical section D, after each layer is sequentially formed with, for example, the epitaxial growth, a cylindrical-shape constituting a vertical resonator is formed by etching and others as shown in FIG. 16B in which each condition of sections C and D are indicated and at first a low refractive-index region 21 is formed by the selective-etching. Then, as shown in FIG. 16C, the selective-oxidization can be performed from outside.

Figure 16D:
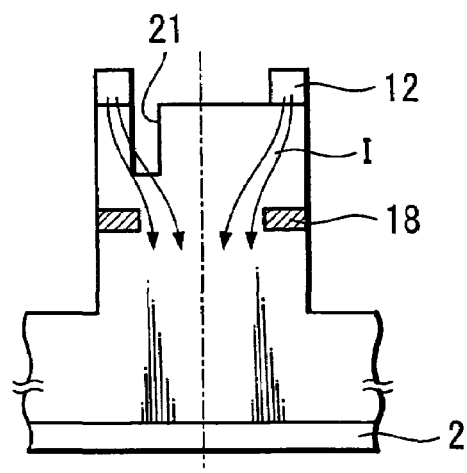

In this case, when the current flows after the first and the second electrodes are ohmic-contacted, as shown in FIG. 16D, the current flows equally in the oxide-contraction opening 18a.

Figure 17A:
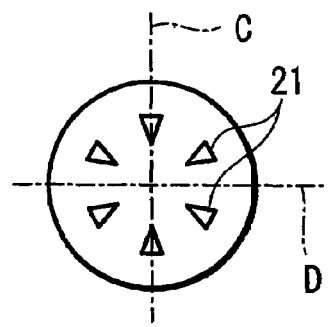
FIGS. 17A to 17D are process diagrams showing an example of a method for manufacturing a surface-emitting semiconductor laser according to an embodiment of the present invention.
Figure 17B:
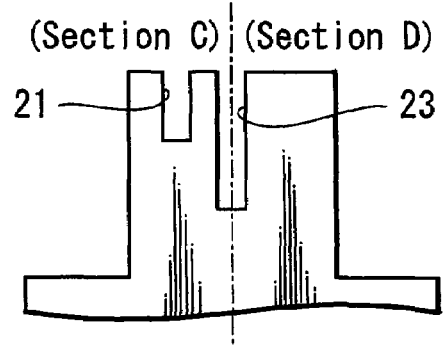

As similarly shown in FIG. 17A, when a low refractive-index region 21 is the hole having a triangle section, and a section C is the section on which the low refractive-index region 21 exists and a section D is the section on which the low refractive-index region 21 does not exist, a low refractive-index region 21 is formed by the selective etching and others as shown in FIG. 17B, and, for example, concurrently a hole 22 having the depth reaching to an active layer (not-shown) is formed in the center portion.

Figure 17C:
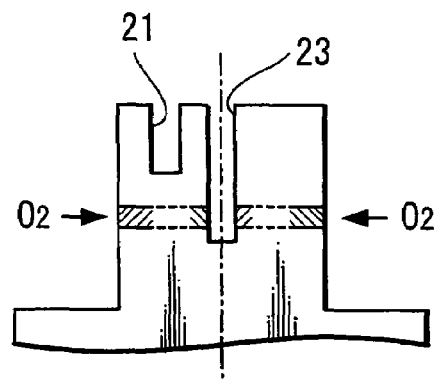
Figure 17D:
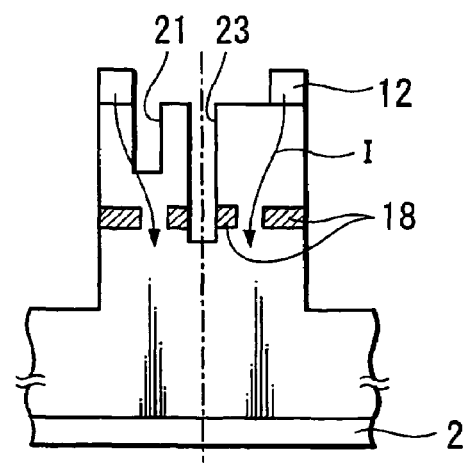

Subsequently, as shown in FIG. 17C, by selectively oxidizing a position where a oxide-contracting layer is formed, the oxidization proceeds through a oxide-contraction layer 18 from the side surface of center hole 22 and from the outside surface of vertical resonator with the proper selection of the oxidation time for example to form an approximately ring-shaped oxide-contraction opening 18a. When in the above construction the current flows after the first and the second electrode are ohmic-contacted, the current flows selectively in a ring-shaped region except the central portion as shown in FIG. 17D.

With the above construction, the low threshold value of current was obtained in comparison with the case in which an oxide-contraction opening 18a was made approximately circular in the conventional examples.

As is evident from the light-emission pattern in the laser oscillation of the surface-emitting semiconductor laser having the structure as shown in the above-described FIG. 11 or 13, between the scattering-loss portions or between the low refractive-index regions a strong light-strength-distribution is provided and the light-strength-distribution in the center portion is comparatively small in comparison with that of the outer circumferential portion.

This means that a contribution to the laser oscillation of the current which flows in the scattering-loss-structure portion or in the low refractive-index region, that is, in the center portion of the low refractive-index region in the drawing, namely at the center of an oxide-contraction opening is small to be the useless-current, so that it becomes a factor that makes the quantum efficiency low in a surface-emitting semiconductor laser. The decline in the quantum efficiency has such a disadvantage for actual use as the rise of the oscillation threshold value of the current and the operational current, so that an extra electric power is needed.

In an embodiment, an oxide-contraction opening 18a is formed in an approximately ring-shape to control the current flow to the center portion where the contribution to laser oscillation is small, so that the useless current is reduced and the threshold value of the current can be low.

In an example in which a plurality of refractive-index regions 21, for example three or more of for example the cavities, penetrate a cap layer 10 and are formed, for example, in the second DBR 9 and in the second clad layer 8 at intervals in the circumferential direction of a resonator, the threshold current was studied in the case where the first and second electrodes and the material of each layer are selected similarly to the above-described first to third embodiments to manufacture a surface-emitting semiconductor laser.

When the center hole was not provided in the center, the current flew through the whole area of the oxide-contraction opening having the diameter of 14 µm, and oscillation threshold current at that time was 4.5 mA.

In an embodiment, when the center hole 22 having the diameter of approximately 3 µm was provided in the center portion and the oxide-contraction layer having the diameter of 5.6 µm was provided outside the center hole 22, since the light strength in the oscillation of this surface-emitting semiconductor laser in the region except the region having the diameter of 5.6 µm in the center of the oxide-contraction opening 18a occupies 95% of the whole, the output losses is confined to 5% even if the region which does not oscillate is provided in the center portion. On the other hand, at this time the area of the oxide-contraction opening 18 through which the current flows becomes 16% narrow to be 84%. If the oscillation threshold current density is constant, it is obvious that the oscillation threshold current is reduced to 3.8 mA of 0.84 times.

Further, the ratio of the oxidized quantity in the outer circumference of the oxide-contraction layer to the oxidized quantity in the side of center hole can be set to a comparatively arbitrary value by adjusting the shape of the center hole and vertical resonator, that is, adjusting a so-called mesa diameter or making the use of lowness of oxygen-molecule fluidity inside the center hole, so that the shape of the oxide-contraction opening can easily be adjusted.

As described above, in the surface-emitting semiconductor laser according to an embodiment, the oxide-contraction layer is provided and the shape of the oxide-contraction opening is formed as an approximately ring-shape with which the current hardly flows into the center of a resonator, so that the current can be used more effectively and the oscillation threshold current can be reduced.

It should be noted that the surface-emitting semiconductor laser according to an embodiment is not limited to the above-described embodiments; and a variety of constructions and shapes of the scattering-loss-structure portion or low refractive-index region and a variety of materials in the structure of the substrate and each layer can be used. As an example, materials of the substrate and each layer suitable for use in the present invention and oscillation-wavelengths thereof are shown in the following table 1.

TABLE 1

| Baffer layer | n-type GaAs | | |
|---|---|---|---|
| First DBR | n-type AlGaAs laminate layer | n-type GaAs/AlGaAs laminate layer | |
| First clad layer | AlGaAs | GaNAs | InP |
| Active layer | AlGaAs/GaAs laminate layer | GaInNAs/GaNAs laminate layer | InGaAsP/InP laminate layer |
| Second clad layer | AlGaAs | GaNAs | InP |
| Second DBR | p-type AlGaAs laminate layer | p-type GaAs/AlGaAs laminate layer | SiO2/TiO2 laminate layer |
| Cap layer | p-type GaAs | p-type GaAs | p-type InP |
| Oscillation wavelength | 850 nm | 1300 nm | 1550 nm |

Further, the present invention can be applied to various kinds of construction of a surface-emitting semiconductor laser within the range that does not depart from the construction of the present invention.

Next, various embodiments illustrative of an optical device having a light-source device that includes a surface-emitting semiconductor laser are explained below referring to FIGS. 18 to 20.

In an embodiment, an optical pickup device used for recording/reproducing on an optical recording medium such as a CD is explained as an example of the optical device.

Figure 18:
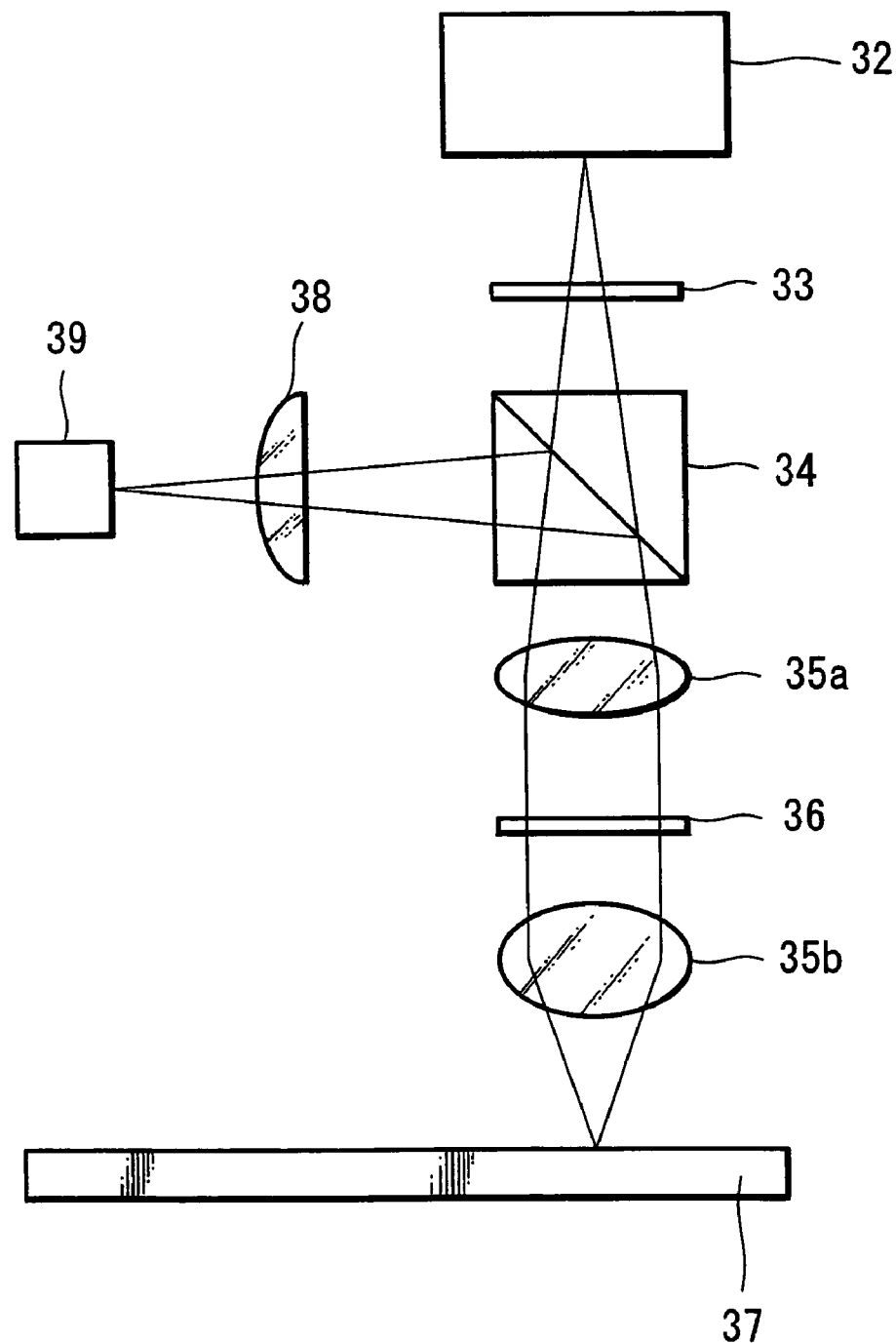
FIG. 18 is a schematic constitutional view of an optical pickup device as an example of an optical device according to an embodiment of the present invention.

As shown in the schematic constitutional view of FIG. 18, the optical device according to an embodiment, namely an optical-pickup device 31 includes a light-source device 32 having a semiconductor laser 1 (not-shown), a grating 33 that forms a desired light spot, a polarized light beam splitter 34, collimator lenses 35a and 35b, a ¼-wavelength shift plate 36, an optical recording medium 37, a cylindrical lens 38 and a photo detector 39.

Laser light of the surface-emitting semiconductor laser 1 according an embodiment to emitted from the light-source device 32 passes through the grating 33 and the polarized light beam splitter 34, light is made parallel at the collimator lens 35a, made into a circular polarized light, and is made to focus on the optical recording medium 37 by the collimator lens 35b; and for example, light reflected on the surface of pit is linearly polarized by the collimator lens 35b and the ¼-wavelength shift plate 36 and passes through a collimator-lens 35a, reflected by the polarized light beam splitter 34, and is focused on a photo detector 39 through a cylindrical lens 38.

The light-source device 32 has the surface-emitting semiconductor laser 1 according to an embodiment, in which a vertical direction resonator is formed by disposing the first and second DBRs with an active layer in between, a scattering-loss-structure portion causing a scattering-loss is disposed on the outer circumferential portion of a resonator, and the scattering-loss-structure portion is composed of a number of cavities that have opposing ends or a number of low refractive-index regions having the opposing ends that are made by filling material of low refractive-index up in the cavities disposed at intervals in the circumferential direction of a resonator.

Further, the surface-emitting semiconductor laser 1 constituting the light-source device 32 may have the structure in which the shape of a cross section, intersecting the direction of current flow of a main current path, of the opposing ends of a plurality of, for example thee or more, low refractive-index regions is made tapered for example to be an acute angle in the direction toward the center of a main current path of a laser.

In the optical device with this construction, using the surface-emitting semiconductor laser according to the present invention constituting the light-source device 32, laser light of the single horizontal mode and high power is emitted, so that speed-up of the operation becomes possible in the recording/reproducing on the optical recording medium 37.

In an embodiment, for example, an optical projection device in which an exposure operation is performed on a photo-conductor in a laser printer is explained as an example of the optical device.

Figure 19A:
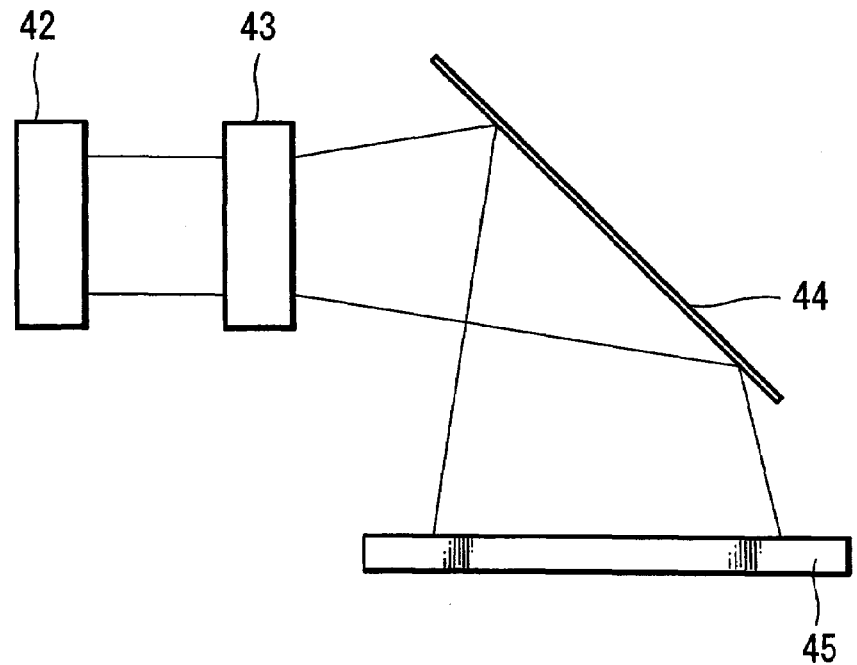
FIGS. 19A and 19B are schematic constitutional views showing the structure of an optical projection device in a laser printer as an example of an optical device according to an embodiment of the present invention.

As shown, for example, in a schematic constitutional view of FIG. 19A, the optical device in this embodiment, namely an optical projection device 41 for the laser printer includes a light-source device 42 having a surface-emitting semiconductor laser (not-shown) according to an embodiment, an expanding optical system 43, a mirror 44 and a photo-conductor 45.

In an embodiment, a light-source constituting a light-source device 42 has the VCSEL array structure which is formed of a number of two-dimensionally integrated semiconductor lasers according to the present invention (not-shown), and laser light emitted from the light-source device 42 passes through the expanding optical system 43, a photo-conductor 45 is irradiated therewith by a mirror 44, and the exposure of desired pattern is made.

The light-source device 42 has the surface-emitting semiconductor laser 1 according to the present invention, in which a vertical direction resonator is formed by disposing the first and second DBRs with an active layer in between, a scattering-loss-structure portion causing a scattering-loss is disposed on the outer circumferential portion of a resonator, and the scattering-loss-structure portion is composed of a plurality of cavities that have opposing ends or a number of low refractive-index regions having the opposing ends that are made by filling material of low refractive-index up in the cavities disposed at intervals in the circumferential direction of a resonator.

Further, the surface-emitting semiconductor laser 1 constituting the light-source device 42 may have the structure in which the shape of a cross section, intersecting the direction of current flow of a main current path, of the opposing ends of a plurality of, for example thee or more, low refractive-index regions is made tapered for example to be an acute angle in the direction toward the center of a main current path of a laser.

In the optical device with this construction, using the surface-emitting semiconductor laser according to an embodiment constituting the light-source device 42, laser light of the single horizontal mode and high power is emitted, so that high speed output using high output laser light becomes possible in the projection onto the photo-conductor 45.

Figure 19B:
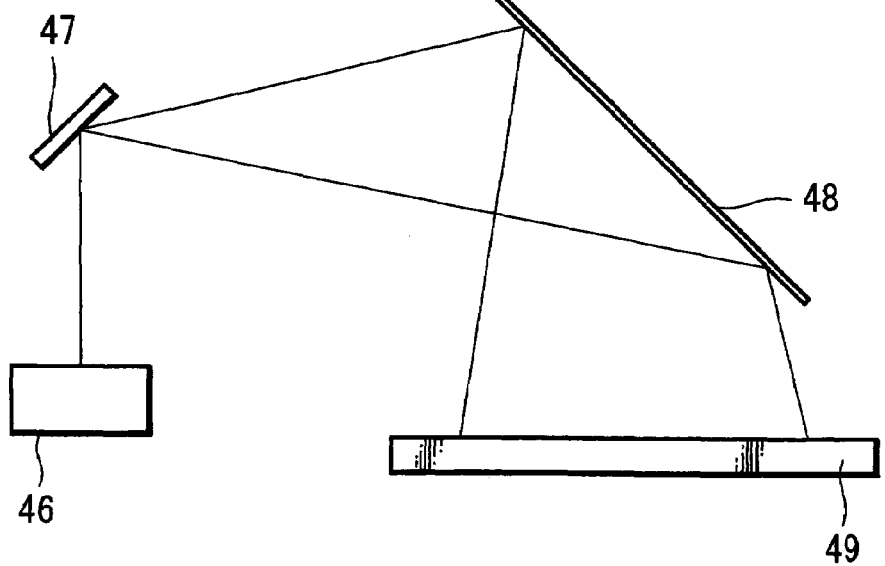

Further, as shown, for example, in the schematic constitutional view of FIG. 19B, the optical device in this embodiment, namely the optical projection device 41 for the laser printer may includes a light-source device 46, a movable-mirror 47 formed of a polygon-mirror or galvano-mirror for example, a mirror 48 and a photo-conductor 49.

In an embodiment, light emitted from the light-source device 46 that has a surface-emitting semiconductor laser according to the present invention (not-shown) is projected two-dimensionally onto a mirror 48 by a movable-mirror 47, a photo-conductor 49 is irradiated therewith, and the exposure of desired pattern is made.

The light-source device 46 has the surface-emitting semiconductor laser 1 according to an embodiment, in which a vertical direction resonator is formed by disposing the first and second DBRs with an active layer in between, a scattering-loss-structure portion causing a scattering-loss is disposed on the outer circumferential portion of a resonator, and the scattering-loss-structure portion is composed of a plurality of cavities that have opposing ends or a plurality of low refractive-index regions having the opposing ends that are made by filling material of low refractive-index up in the cavities disposed at intervals in the circumferential direction of a resonator.

Further, the surface-emitting semiconductor laser 1 constituting the light-source device 46 may have the structure in which the shape of a cross section, intersecting the direction of current flow of a main current path, of the opposing ends of a plurality of, for example thee or more, low refractive-index regions is made tapered for example to be an acute angle in the direction toward the center of a main current path of a laser.

In the optical device with this construction, using the surface-emitting semiconductor laser according to an embodiment constituting the light-source device 46, laser light of the single horizontal mode and high power is emitted, so that high speed output using high output laser light becomes possible in the projection onto the photo-conductor 49.

In an embodiment, a communication device is explained as an example of the optical device.

Figure 20:
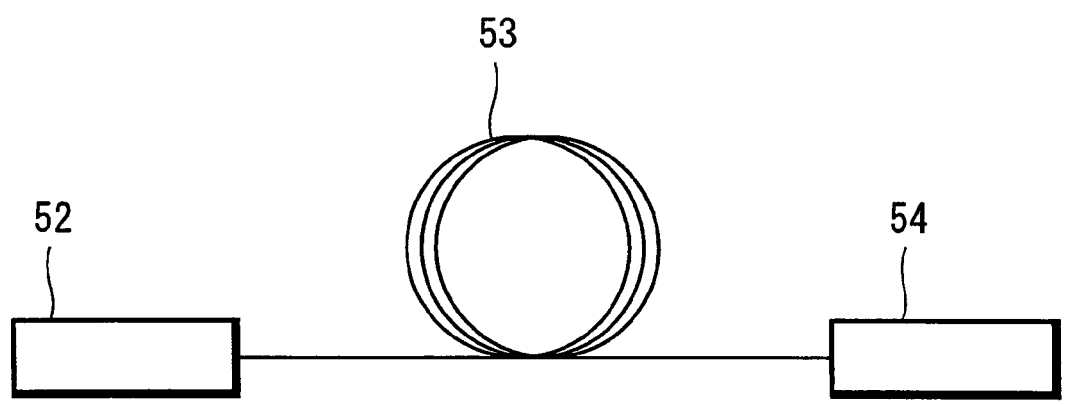
FIG. 20 is a schematic constitutional view of a communication device as an example of an optical device according to an embodiment.

As shown in the schematic perspective view of FIG. 20, an optical device 51 in this embodiment has a light-source device, namely a transmitting device 52, an optical-fiber 53 and a receiving device 54.

The light-source device 52 has the surface-emitting semiconductor laser 1 (not shown) according to an embodiment, in which a vertical direction resonator is formed by disposing the first and second DBRs with an active layer in between, a scattering-loss-structure portion causing a scattering-loss is disposed on the outer circumferential portion of a resonator, and the scattering-loss-structure portion is composed of a plurality of cavities that have opposing ends or a plurality of low refractive-index regions having the opposing ends that are made by filling material of low refractive-index up in the cavities disposed at intervals in the circumferential direction of a resonator.

Further, the surface-emitting semiconductor laser 1 constituting the light-source device 52 may have the structure in which the shape of a cross section, intersecting the direction of current flow of a main current path, of the opposing ends of a plurality of, for example thee or more, low refractive-index regions is made tapered for example to be an acute angle in the direction toward the center of a main current path of a laser.

Various embodiments illustrative of an optical device are described herein without limitation thereof where various modifications and changes can be made.

A surface-emitting semiconductor laser according to an embodiment that includes a light-source device of an optical device may have the structure in which the shape of a cross section, intersecting the direction of current flow of a main current path, of the opposing ends of a plurality of, for example thee or more, low refractive-index regions is made tapered for example to be an acute angle in the direction toward the center of a main current path of a laser Furthermore, as an optical device having a light-source device including a surface-emitting semiconductor laser according to an embodiment, various other devices than the above described communication device having a light-source device including a surface-emitting semiconductor laser according to the present invention, such as a transmission device or an optical integrated-circuit device can be used.

Furthermore, in an optical device according to the present invention, a so-called array-laser can be formed of a plurality of the surface-emitting semiconductor lasers on one substrate or a plurality of substrates, and various modifications and changes of a surface-emitting semiconductor lasers and an optical device according to the present invention can be made.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A surface-emitting semiconductor laser comprising first and second Distribution Bragg Reflectors with an active layer in between that are disposed to form a vertical direction resonator, wherein
    a scattering-loss-structure portion causing scattering-loss is disposed on an outer circumferential portion of the resonator and which does not extend fully to the center of the resonator and is arranged about a main current path of the laser, and
    the scattering-loss-structure portion has at least one opposing end which opposes to the main current path of the laser.

2. A surface-emitting semiconductor laser comprising first and second DBRs with an active layer in between that are disposed to form a vertical direction resonator, wherein
    any one of a cavity and a low refractive-index region made by filling material of low refractive-index in a cavity, which has at least one opposing end that opposes to a main current path of the laser, is disposed in an outer circumferential portion of the resonator and which does not extend fully to the center of the resonator, and is arranged about the main current path of the laser, and
    a shape of section, intersecting a direction of current flow of the main current path, of an opposing end of the low refractive-index region is tapered in a direction toward a center of the main current path of the laser.

3. A surface-emitting semiconductor laser according to claim 2, wherein
    a plurality of the opposing ends are provided at intervals and are approximately disposed on concentric circles with respect to a center axis of the main current path.

4. A surface-emitting semiconductor laser according to claim 2, wherein
    a plurality of the opposing ends are provided at regular intervals.

5. A surface-emitting semiconductor laser according to claim 2, further comprising an extended portion that extends in a direction toward an outer circumference of the laser from at least one of said opposing ends, wherein
    the extended portion includes one or more parts that are any one of separately provided, adjacent to each other in a portion thereof and connected to each other.

6. A surface-emitting semiconductor laser according to claim 2, wherein
    three or more of the opposing ends are provided.

7. A surface-emitting semiconductor laser according to claim 2, wherein
    a depth of the scattering-loss-structure portion and of low refractive-index region is selected not to reach the active layer at least at the opposing end with respect to the main current path.

8. A surface-emitting semiconductor laser according to claim 2, wherein
    at least a part of a side surface of the low refractive-index region has an uneven surface including any one of a wavy surface and rough surface.

9. A surface-emitting semiconductor laser according to claim 2, wherein
    a shape of the opposing end of the scattering-loss-structure portion and of the low refractive-index region has a width on a vertical section that becomes wider in a direction away from the active layer.

10. A surface-emitting semiconductor laser according to claim 2, wherein
    a shape of the opposing end of any one of the scattering-loss-structure portion and of the low refractive-index region is gradually changed with respect to a distance from the main current path in a direction away from the active layer.

11. A surface-emitting semiconductor laser according to claim 2, wherein
    at least one interval between any one of the scattering-loss-structure portions and the low refractive-index regions is selected to have one maximum value in an intensity distribution of output light in laser oscillation in a region between any one of the scattering-loss-structure portions and the low refractive-index regions.

12. A surface-emitting semiconductor laser according to claim 2, wherein
    an oxide-contraction layer having an oxide-contraction opening that selects the main current path of the laser is provided between an active layer and any one of the first DBR and the second DBR, and
    the opposing end of the refractive-index region is disposed inside the oxide-contraction opening.

13. A surface-emitting semiconductor laser according to claim 2, wherein
    an oxide-contraction layer having an oxide-contraction opening that selects the main current path of the laser is provided between the active layer and any one of the first DBR and the second DBR, and
    the oxide-contraction opening is approximately ring-shaped that surrounds a center of said resonator.

14. An optical device comprising a light-source device having a surface-emitting semiconductor laser, wherein
    the surface-emitting semiconductor laser has a vertical direction resonator formed by disposing first and second DBRs with an active layer in between; and
    a scattering-loss-structure portion that causes a scattering-loss is disposed in an outer circumferential portion of the resonator and which does not extend fully to the center of the resonator and is arranged about a main current path of the laser, and the scattering-loss-structure portion has at least one opposing end that opposes to the main current path of the laser.

15. An optical device comprising a light-source device having a surface-emitting semiconductor laser, wherein the surface-emitting semiconductor laser has a vertical direction resonator formed by disposing the first and second DBRs with an active layer in between;

any one of a cavity and a low refractive-index region made by filling material of low refractive-index in a cavity, which has at least one opposing end that opposes to a main current path is disposed in an outer circumferential portion of the resonator and which does not extend fully to the center of the resonator, and which is arranged about the main current path of the laser; and a shape of section, intersecting a direction of current flow of the main current path, of the opposing end of the low refractive-index region is tapered in a direction toward a center of the main current path of the laser.

* * * * *